(12) United States Patent
Senga et al.

(10) Patent No.: US 7,366,080 B2
(45) Date of Patent: Apr. 29, 2008

(54) LASER CONTROL UNIT, LASER CONTROL CIRCUIT, AND LASER-POWER ADJUSTMENT METHOD

(75) Inventors: Hisashi Senga, Kadoma (JP); Toshio Matsumoto, Kyoto (JP); Hiromichi Ishibashi, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 589 days.

(21) Appl. No.: 10/986,959

(22) Filed: Nov. 15, 2004

(65) Prior Publication Data

US 2005/0105569 A1    May 19, 2005

(30) Foreign Application Priority Data

Nov. 14, 2003    (JP)    ............... 2003-384896

(51) Int. Cl.
*G11B 7/00* (2006.01)

(52) U.S. Cl. ....................... 369/116; 369/121

(58) Field of Classification Search ................ 369/116, 369/53.22, 47.5, 47.51, 47.53, 124.12, 124.15, 369/124.01, 47.1, 47.52, 120, 121, 122
See application file for complete search history.

(56) References Cited

U.S. PATENT DOCUMENTS 7,082,094 B2 *  7/2006  Morishima et al. ......... 369/116
7,113,468 B2 *  9/2006  Udagawa ................. 369/59.11
7,200,091 B2 *  4/2007  Masui et al. ............. 369/59.11

FOREIGN PATENT DOCUMENTS

JP        2002-203320        7/2002

* cited by examiner

*Primary Examiner*—Nabil Hindi
(74) *Attorney, Agent, or Firm*—Wenderoth, Lind & Ponack, L.L.P.

(57) ABSTRACT

A laser control unit, a laser control circuit and a laser-power adjustment method are provided which are capable of controlling laser power precisely, even if an error is produced in the duty of an optical pulse. A light-receiving element 101 converts the optical pulse into an electric signal and outputs a photo-detection signal; an LPF 114 calculates the average value of the optical pulse, based on the photo-detection signal; a DSP 124 calculates a light-emission power value, based on the average value of the optical pulse and the duty of the optical pulse, and calculates the difference between the light-emission power value and a target power value; an EP-ROM 160 stores a correction value for correcting a calculation which is executed by the DSP 124; the DSP 124 corrects the calculation, based on the correction value, and controls an electric-current value which is supplied to a semiconductor laser 150, based on the calculation result which is obtained from the correction; and a laser drive circuit 40 drives the semiconductor laser 150, based on the electric-current value.

9 Claims, 26 Drawing Sheets

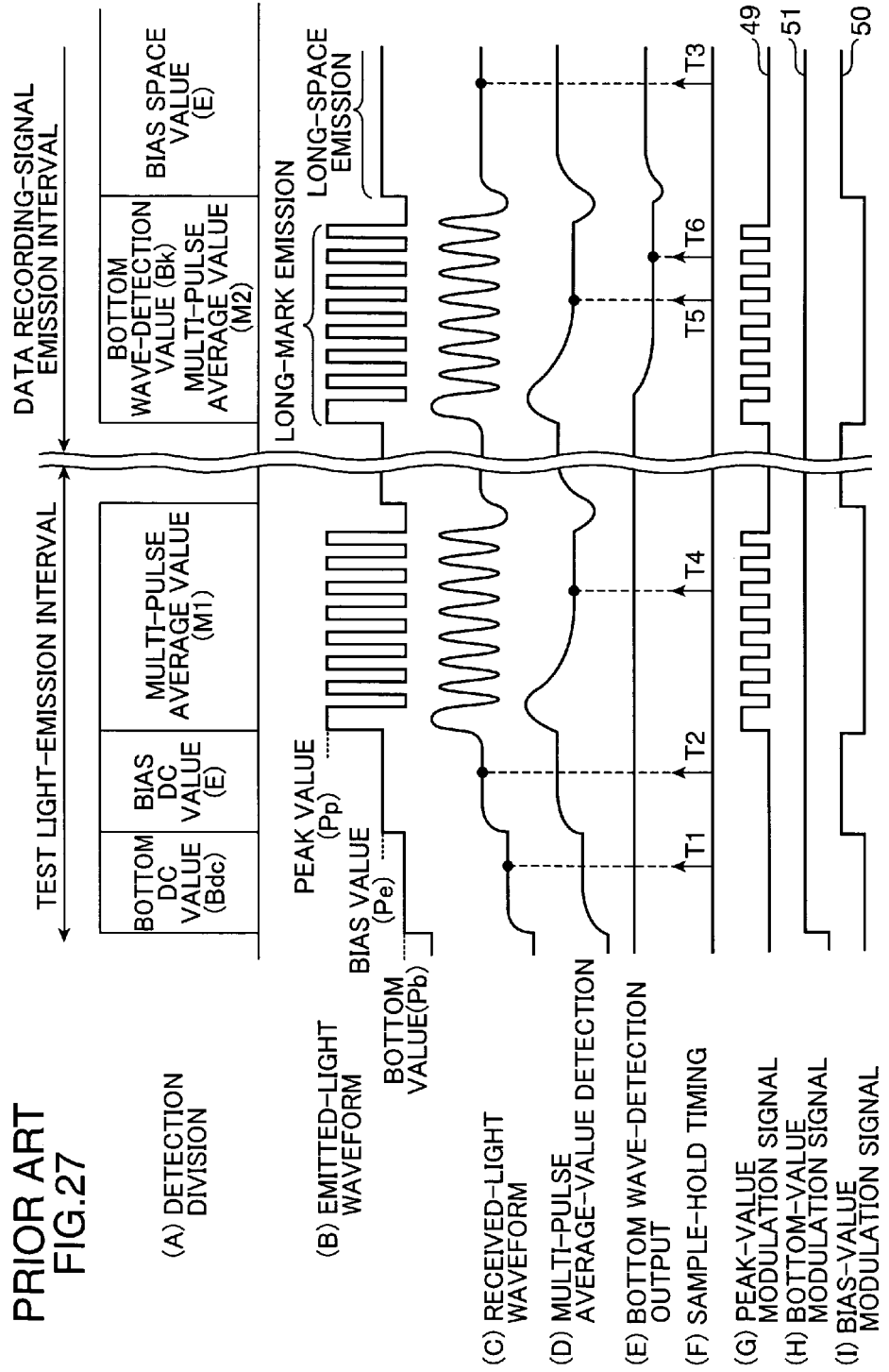

LASER CONTROL UNIT, LASER CONTROL CIRCUIT, AND LASER-POWER ADJUSTMENT METHOD

BACKGROUND OF THE INVENTION

1. Field of the Invention

The present invention relates to a laser control unit, a laser control circuit and a laser-power adjustment method which are capable of controlling the recording optical power of a semiconductor laser which emits a beam of light so that a mark area which corresponds to a data signal can be recorded on an optical disk.

2. Description of the Related Art

In a conventional laser control unit for an optical disk, there is known the following method (e.g., refer to Patent Document 1). In that method, when data is additionally written, feed-forward control of the power value of a recording optical pulse is executed at high speed. Thereby, a beam of light is emitted from a semiconductor laser, at precise power from the head of a sector. FIG. 27 shows a conventional laser control method which is described in Patent Document 1.

First, as shown by detection division in FIG. 27(A) and a waveform of emitted light in FIG. 27(B), an optical pulse is generated which is made up of a constant emission of bottom power, a constant emission of bias power, and a multi-pulse emission. This optical pulse is received by a photo-detector and is converted into an electric current. Then, it is converted into a voltage in a current-voltage conversion circuit, so that a waveform of received light is obtained as shown in FIG. 27(C). Based on this received-light waveform, there are obtained a bottom DC value Bdc, a bias DC value E, and in addition, an average value M of the multi-pulse segment.

Then, using the obtained bottom DC value Bdc, average value M of the multi-pulse segment and a duty d of the multi-pulse segment, an arithmetic processor calculates a peak value P of the multi-pulse segment which is an unknown numerical value in the following expression (56).

$$P=\{M-Bdc\times(1-d)\}/d \qquad (56)$$

The obtained peak value P, bias value E and bottom value Bdc are compared with set values Pref, Eref and Bref, respectively. Thereby, the arithmetic operations of differential values ΔP, ΔE and ΔB are carried out, respectively.

$$\Delta P=P-Pref \qquad (57)$$

$$\Delta E=E-Eref \qquad (58)$$

$$\Delta B=B-Bref \qquad (59)$$

The differential values ΔP, ΔE and ΔB which have been obtained from these arithmetic operations are added to the peak value P, bias DC value E and bottom DC value Bdc of the present power, respectively, so that they are converted into an electric-current value which is sent to a semiconductor laser. Thereby, the differential values ΔP, ΔE and ΔB are controlled so as to become zero.

If an electric-current conversion coefficient is K, a peak electric-current value is Ip, a bias electric-current value is Ie, and a bottom electric-current value is Ib, then those values are calculated, using the following expressions (60) to (62), respectively.

$$Ip=K(P+\Delta P) \qquad (60)$$

$$Ib=K(B+\Delta B) \qquad (61)$$

$$Ie=K(E+\Delta E) \qquad (62)$$

Using such a method, control is executed so that immediately after data has been recorded, the recording power of a semiconductor laser can be settled at high speed to a target power.

Herein, Patent Document 1 is Japanese Unexamined Patent Publication No. 2002-203320 specification.

However, the above described conventional configuration has the following disadvantage. A pulse-current source which drives a laser has a characteristic which may produce a discrepancy between the duty of the multi-pulse segment and the set duty d. Then, this discrepancy depends upon the current value of the pulse-current source which drives a laser. In the future, it is expected that the speed of processing will be several times as high as the present one, and that the pulse-current value may go up. In that case, such a discrepancy of the duty d becomes larger. While the duty of an optical pulse is shifted from the set duty d, an arithmetic processor calculates a peak value, using the set duty d as it is. This may produce an error in the peak value. When the speed of processing becomes several times as high in the future, an unacceptable error may be produced.

DISCLOSURE OF THE INVENTION

In order to resolve the above described disadvantage, it is an object of the present invention to provide a laser control unit, a laser control circuit and a laser-power adjustment method which are capable of precisely controlling the peak value of an optical pulse, even if there is a discrepancy between the duty of the optical pulse and a set duty.

A laser control unit according to the present invention which executes control so that a light-emission power value of an optical pulse which is used to form a record mark on a recording track of an optical disk becomes a target power value, comprising: an outputting circuit for converting, into an electric signal, the optical pulse which is generated by a semiconductor laser, and outputting a photo-detection signal; an average-value calculating circuit for calculating an average value of the optical pulse, based on the photo-detection signal which is outputted by the outputting circuit; an arithmetic-operation executing circuit for executing an arithmetic operation of the light-emission power value, based on the average value of the optical pulse which is calculated by the average-value calculating circuit and a duty of the optical pulse, and calculating the difference between the light-emission power value and the target power value; a correction-value storing circuit for storing a correction value for correcting an arithmetic operation which is executed by the arithmetic-operation executing circuit; a correcting circuit for correcting the arithmetic operation which is executed by the arithmetic-operation executing circuit, based on the correction value which is stored in the correction-value storing circuit; a controlling circuit for controlling an electric-current value which is supplied to the semiconductor laser, based on the arithmetic result which is corrected by the correcting circuit; and a laser driving circuit for driving the semiconductor laser, based on the electric-current value which is controlled by the controlling circuit.

According to this configuration, the outputting circuit converts the optical pulse generated by a semiconductor laser into an electric signal, and then, outputs a photo-detection signal. Then, the average-value calculating circuit calculates the average value of the optical pulse, based on the photo-detection signal outputted by the outputting circuit. Next, the arithmetic-operation executing circuit executes an arithmetic operation of the light-emission power value, based on the average value of the optical pulse calculated by the average-value calculating circuit and the duty of the optical pulse, and then, calculates the difference between the light-emission power value and the target power value. In the correction-value storing circuit, a correction value is stored which is used to correct an arithmetic operation which is executed by the arithmetic-operation executing circuit. Thus, the correcting circuit corrects the arithmetic operation executed by the arithmetic-operation executing circuit, based on the correction value stored in the correction-value storing circuit. Sequentially, the controlling circuit controls the electric-current value which is supplied to the semiconductor laser, based on the arithmetic result corrected by the correcting circuit. Finally, the laser driving circuit drives the semiconductor laser, based on the electric-current value controlled by the controlling circuit.

Therefore, even if the duty of an optical pulse is shifted from a preset duty, the peak value of the optical pulse can be precisely controlled. This makes it possible to control the laser power more precisely.

In the above described laser control unit, it is preferable that: the correction-value storing circuit stores the intercept and gradient of a linear function as the correction value, the linear function being obtained by approximating the relation between the target power value and the light-emission power value in advance; the correcting circuit correct the target power value, based on the correction value which is stored in the correction-value storing circuit; the arithmetic-operation executing circuit execute an arithmetic operation of the difference between the target power value corrected by the correcting circuit and the light-emission power value; the controlling circuit control an electric-current value which is supplied to the semiconductor laser, based on the difference which is calculated by the arithmetic-operation executing circuit.

According to this configuration, in the correction-value storing circuit, the relation between the target power value and the light-emission power value is expressed approximately as a linear function in advance, and the intercept and gradient of the approximate linear function are stored as the correction value. Thus, the correcting circuit corrects the target power value, based on the correction value stored in the correction-value storing circuit. Then, the arithmetic-operation executing circuit executes an arithmetic operation of the difference between the target power value corrected by the correcting circuit and the light-emission power value. Finally, the controlling circuit controls the electric-current value which is supplied to the semiconductor laser, based on the difference calculated by the arithmetic-operation executing circuit.

Hence, the relation between the target power value and the light-emission power value is expressed approximately as a linear function in advance, and the intercept and gradient of the approximate linear function are stored beforehand as the correction value. Therefore, the target power value can be easily corrected, thus controlling the laser extremely precisely.

In the above described laser control unit, preferably: the correction-value storing circuit should store, as the correction value, the discrepancy between the light-emission power value and the target power value; the correcting circuit should correct the target power value, based on the correction value which is stored in the correction-value storing circuit; the arithmetic-operation executing circuit should execute an arithmetic operation of the difference between the target power value corrected by the correcting circuit and the light-emission power value; and the controlling circuit should control an electric-current value which is supplied to the semiconductor laser, based on the difference which is calculated by the arithmetic-operation executing circuit.

According to this configuration, in the correction-value storing circuit, the discrepancy between the target power value and the light-emission power value is stored as the correction value. Thus, the correcting circuit corrects the target power value, based on the correction value stored in the correction-value storing circuit. Then, the arithmetic-operation executing circuit executes an arithmetic operation of the difference between the target power value corrected by the correcting circuit and the light-emission power value. Finally, the controlling circuit controls the electric-current value which is supplied to the semiconductor laser, based on the difference calculated by the arithmetic-operation executing circuit.

Hence, the discrepancy between the target power value and the light-emission power value is stored in advance as the correction value. Therefore, the target power value can be easily corrected, thus controlling the laser extremely precisely.

In the above described laser control unit, it is preferable that: the correction-value storing circuit store, as the correction value, the relation between the duty of the optical pulse and the target power value; the correcting circuit correct the duty which corresponds to the target power value, based on the correction value which is stored in the correction-value storing circuit; the arithmetic-operation executing circuit execute an arithmetic operation of the light-emission power value, based on the average value of the optical pulse which is calculated by the average-value calculating circuit and the duty which is corrected by the correcting circuit, and calculating the difference between the light-emission power value and the target power value; and the controlling circuit control an electric-current value which is supplied to the semiconductor laser, based on the difference which is calculated by the arithmetic-operation executing circuit.

According to this configuration, in the correction-value storing circuit, the relation between the target power value and the light-emission power value is stored as the correction value. Thus, the correcting circuit corrects the duty which corresponds to the target power value, based on the correction value stored in the correction-value storing circuit. Then, the arithmetic-operation executing circuit executes an arithmetic operation of the light-emission power value, based on the average value of the optical pulse calculated by the average-value calculating circuit and the duty corrected by the correcting circuit, and then, calculates the difference between the light-emission power value and the target power value. Finally, the controlling circuit controls the electric-current value which is supplied to the semiconductor laser, based on the difference calculated by the arithmetic-operation executing circuit.

Hence, the relation between the duty of the optical pulse and the target power value is stored beforehand as the correction value. Therefore, the duty which corresponds to the target power value can be easily corrected, thus controlling the laser extremely precisely.

A laser control unit according to another aspect of the present invention which executes control so that a light-emission power value of an optical pulse which is used to form a record mark on a recording track of an optical disk becomes a target power value, comprising: an optical-pulse generating circuit for generating a first optical pulse which includes a first duty, and generating a second optical pulse which includes a second duty different from the first duty; an outputting circuit for converting, into an electric signal, the first optical pulse which is generated by the optical-pulse generating circuit and outputting a first photo-detection signal, and converting, into an electric signal, the second optical pulse which is generated by the optical-pulse generating circuit and outputting a second photo-detection signal; an average-value calculating circuit for calculating an average value of the first optical pulse, based on the first photo-detection signal which is outputted by the outputting circuit, and calculating an average value of the second optical pulse, based on the second photo-detection signal which is outputted by the outputting circuit; a peak-value calculating circuit for calculating an peak value of the optical pulse, based on the average value of the first optical pulse which is calculated by the average-value calculating circuit and the average value of the second optical pulse which is calculated by the average-value calculating circuit; a controlling circuit for calculating the relation of light-emission power to an electric current for driving a semiconductor laser, based on the peak value which is calculated by the peak-value calculating circuit, and controlling an electric-current value which is supplied to the semiconductor laser; and a laser driving circuit for driving the semiconductor laser, based on the electric-current value which is controlled by the controlling circuit.

According to this configuration, the optical-pulse generating circuit generates a first optical pulse which includes a first duty, and generates a second optical pulse which includes a second duty different from the first duty. Next, the outputting circuit converts, into an electric signal, the first optical pulse generated by the optical-pulse generating circuit and outputs a first photo-detection signal, and then, converts, into an electric signal, the second optical pulse generated by the optical-pulse generating circuit and outputs a second photo-detection signal. Sequentially, the average-value calculating circuit calculates the average value of the first optical pulse, based on the first photo-detection signal outputted by the outputting circuit, and calculates the average value of the second optical pulse, based on the second photo-detection signal outputted by the outputting circuit. Then, the peak-value calculating circuit calculates an peak value of the optical pulse, based on the average value of the first optical pulse calculated by the average-value calculating circuit and the average value of the second optical pulse calculated by the average-value calculating circuit. Next, the controlling circuit calculates the relation of light-emission power to an electric current for driving a semiconductor laser, based on the peak value calculated by the peak-value calculating circuit, and then, controls an electric-current value which is supplied to the semiconductor laser. Finally, the laser driving circuit drives the semiconductor laser, based on the electric-current value controlled by the controlling circuit.

Hence, two optical pulses whose duties are different from each other are generated. Then, based upon those generated optical pulses, an peak value is calculated. Next, based upon the calculated peak value, the electric-current value which is supplied to the semiconductor laser is controlled. Therefore, even if the duty of an optical pulse is shifted from a preset duty, the peak value of the optical pulse can be precisely controlled. This makes it possible to control the laser power more precisely.

It is preferable that the above described laser control unit further comprise a correction-value storing circuit for storing in advance, as a correction value, the discrepancy between a duty and the target power value, wherein: the peak-value calculating circuit correct the peak value of the optical pulse, using the correction value which is stored in the correction-value storing circuit; the controlling circuit calculate the relation of light-emission power to an electric current for driving the semiconductor laser, based on the peak value which is calculated by the peak-value calculating circuit, and control an electric-current value which is supplied to the semiconductor laser; and the laser driving circuit drive the semiconductor laser, based on the electric-current value which is controlled by the controlling circuit.

According to this configuration, the discrepancy between a duty and the target power value is stored in advance as a correction value in the correction-value storing circuit. Thus, the peak-value calculating circuit corrects the peak value of the optical pulse, using the correction value stored in the correction-value storing circuit. Then, the controlling circuit calculates the relation of light-emission power to an electric current for driving the semiconductor laser, based on the peak value calculated by the peak-value calculating circuit, and then, controls an electric-current value which is supplied to the semiconductor laser. Finally, the laser driving circuit drives the semiconductor laser, based on the electric-current value controlled by the controlling circuit.

Hence, the discrepancy between a duty and the target power value is stored in advance as a correction value, and using this correction value, the peak value of the optical pulse is corrected. Therefore, the peak value can be calculated without being affected by the duty's discrepancy.

A laser control circuit according to the present invention which executes control so that a light-emission power value of an optical pulse which is used to form a record mark on a recording track of an optical disk becomes a target power value, comprising: an arithmetic-operation executing circuit for executing an arithmetic operation of the light-emission power value, based on an average value of the optical pulse which is calculated based on a photo-detection signal which is outputted after the optical pulse generated by a semiconductor laser is converted into an electric signal and a duty of the optical pulse, and calculating the difference between the light-emission power value and the target power value; a correcting circuit for correcting the arithmetic operation which is executed by the arithmetic-operation executing circuit, based on a correction value which is stored in a correction-value storing circuit which stores the correction value for correcting the arithmetic operation executed by the arithmetic-operation executing circuit; and a controlling circuit for controlling an electric-current value which is supplied to a laser driving circuit for driving the semiconductor laser, based on the arithmetic result which is corrected by the correcting circuit.

According to this configuration, the arithmetic-operation executing circuit executes an arithmetic operation of the light-emission power value, based on an average value of the optical pulse which is calculated based on a photo-detection signal which is outputted after the optical pulse generated by a semiconductor laser is converted into an electric signal and a duty of the optical pulse, and then, calculates the difference between the light-emission power value it has obtained and the target power value. Next, the correcting circuit corrects the arithmetic operation which is executed by the arithmetic-operation executing circuit, based on a correction value which is stored in a correction-value storing circuit which stores the correction value for correcting the arithmetic operation executed by the arithmetic-operation executing circuit. Then, the controlling circuit controls an electric-current value which is supplied to a laser driving circuit that drives the semiconductor laser, based on the arithmetic result corrected by the correcting circuit.

Therefore, even if the duty of an optical pulse is shifted from a preset duty, the peak value of the optical pulse can be precisely controlled. This makes it possible to control the laser power more precisely.

A laser-power adjustment method according to the present invention, comprising: a first step of setting a target power value of an optical pulse; a second step of generating a predetermined optical pulse, based on the target power value which is set in the first step, and obtaining a photo-detection signal by converting the generated optical pulse into an electric signal; a third step of calculating the difference between the photo-detection signal which is obtained in the second step and the target power value of the optical pulse, and based on the difference, executing control so that an electric-current value which is sent to a semiconductor laser becomes equivalent to the target power value; a fourth step of measuring a light-emission power value of the optical pulse which is controlled in the third step, using a photo-detector; a fifth step of executing an increment of the target power value of the optical pulse; and a sixth step of calculating, as a correction value, the relation between the target power value and the light-emission power value, by repeating the first to fifth steps.

According to this configuration, in the first step, a target power value of an optical pulse is set. Next, in the second step, based on the set target power value, a predetermined optical pulse is generated, and then, a photo-detection signal is obtained by converting the generated optical pulse into an electric signal. Sequentially, in the third step, the difference between the obtained photo-detection signal and the target power value of the optical pulse is calculated, and then, based on this difference, control is executed so that an electric-current value which passes through a semiconductor laser becomes equivalent to the target power value. Next, in the fourth step, a, light-emission power value of the controlled optical pulse is measured using a photo-detector. Then, in the fifth step, an increment of the target power value of the optical pulse is executed, so that the target power value of the optical pulse is set again. This processing is repeated, and thus, the relation between the target power value and the light-emission power value is calculated as a correction value. Then, the calculated correction value is stored beforehand in a correction-value storing circuit. Using this correction value, the laser power can be controlled more precisely.

A laser-power adjustment method according to another aspect of the present invention, comprising: a first step of setting a target power value of an optical pulse; a second step of generating a predetermined optical pulse, based on the target power value which is set in the first step, obtaining a photo-detection signal by converting the generated optical pulse into an electric signal, and calculating an average value of the optical pulse; a third step of executing a DC emission of the optical pulse which is generated in the second step, at a peak value thereof, obtaining a photo-detection signal by converting the optical pulse whose DC emission is executed at the peak value into an electric signal, and calculating the peak value of the optical pulse; a fourth step of calculating a duty of the optical pulse, based on the average value of the optical pulse which is calculated in the second step and the peak value of the optical pulse which is calculated in the third step; a fifth step of executing an increment of the target power value of the optical pulse; and a sixth step of calculating, as a correction value, the relation between the target power value and the duty of the optical pulse, by repeating the first to fifth steps.

According to this configuration, in the first step, a target power value of an optical pulse is set. Next, in the second step, based on the set target power value, a predetermined optical pulse is generated, then a photo-detection signal is obtained by converting the generated optical pulse into an electric signal, and the average value of the optical pulse is calculated. Sequentially, in the third step, a DC emission of the generated optical pulse is executed at its peak value, then a photo-detection signal is obtained by converting, into an electric signal, the optical pulse whose DC emission is executed at the peak value, and the peak value of the optical pulse is calculated. Next, in the fourth step, the duty of the optical pulse is calculated, based on the average value of the optical pulse and the peak value of the optical pulse. Then, in the fifth step, an increment of the target power value of the optical pulse is executed, so that the target power value of the optical pulse is set again. This processing is repeated, and thus, the relation between the target power value and the duty is calculated as a correction value. Then, the calculated correction value is stored beforehand in a correction-value storing circuit. Using this correction value, the laser power can be controlled more precisely.

A laser-power adjustment method according to still another aspect of the present invention, comprising: a first step of setting a target power value of an optical pulse; a second step of generating a first optical pulse which includes a first duty, based on the target power value which is set in the first step, obtaining a photo-detection signal by converting the generated first optical pulse into an electric signal, and calculating an average value of the first optical pulse; a third step of generating a second optical pulse which includes a second duty different from the first duty, based on the target power value which is set in the first step, obtaining a photo-detection signal by converting the generated second optical pulse into an electric signal, and calculating an average value of the second optical pulse; a fourth step of calculating a peak value of the optical pulse, based on the average value of the first optical pulse which is calculated in the second step and the average value of the second optical pulse which is calculated in the third step; a fifth step of calculating the relation of light-emission power to an electric current for driving a semiconductor laser, based on the peak value which is calculated in the fourth step, and controlling an electric-current value which is supplied to the semiconductor laser; and a sixth step of driving the semiconductor laser, based on the electric-current value which is controlled in the fifth step.

According to this configuration, in the first step, a target power value of an optical pulse is set. Next, in the second step, a first optical pulse which includes a first duty is generated based on the set target power value, then a photo-detection signal is obtained by converting the generated first optical pulse into an electric signal, and an average value of the first optical pulse is calculated. Sequentially, in the third step, a second optical pulse which includes a second duty different from the first duty is generated based on the set target power value, then a photo-detection signal is obtained by converting the generated second optical pulse into an electric signal, and an average value of the second optical pulse is calculated. Then, in the fourth step, a peak value of the optical pulse is calculated based on the average value of the first optical pulse and the average value of the second optical pulse. Next, in the fifth step, the relation of light-emission power to an electric current for driving a semiconductor laser is calculated based on the calculated peak value, and then, an electric-current value which is supplied to the semiconductor laser is controlled. Finally, in the sixth step, the semiconductor laser is driven based on the controlled electric-current value.

Hence, two optical pulses whose duties are different from each other are generated. Then, based upon those generated optical pulses, an peak value is calculated. Next, based upon the calculated peak value, the electric-current value which is supplied to the semiconductor laser is controlled. Therefore, even if the duty of an optical pulse is shifted from a preset duty, the peak value of the optical pulse can be precisely controlled. This makes it possible to control the laser power more precisely.

According to the present invention, even if the duty of an optical pulse is shifted from a preset duty, the peak value of the optical pulse can be precisely controlled. This makes it possible to control the laser power more precisely.

These and other objects, features and advantages of the present invention will become more apparent upon reading of the following detailed description along with the accompanied drawings.

BRIEF DESCRIPTION OF THE DRAWINGS

FIG. 27 is a graphical representation, showing an operational sequence of a laser control unit according to a prior art.

DETAILED DESCRIPTION OF INVENTION

Hereinafter, embodiments of the present invention will be described with reference to the drawings.

First Embodiment

Hereinafter, desirable embodiments for implementing the present invention will be described with reference to the drawings.

Figure 1:
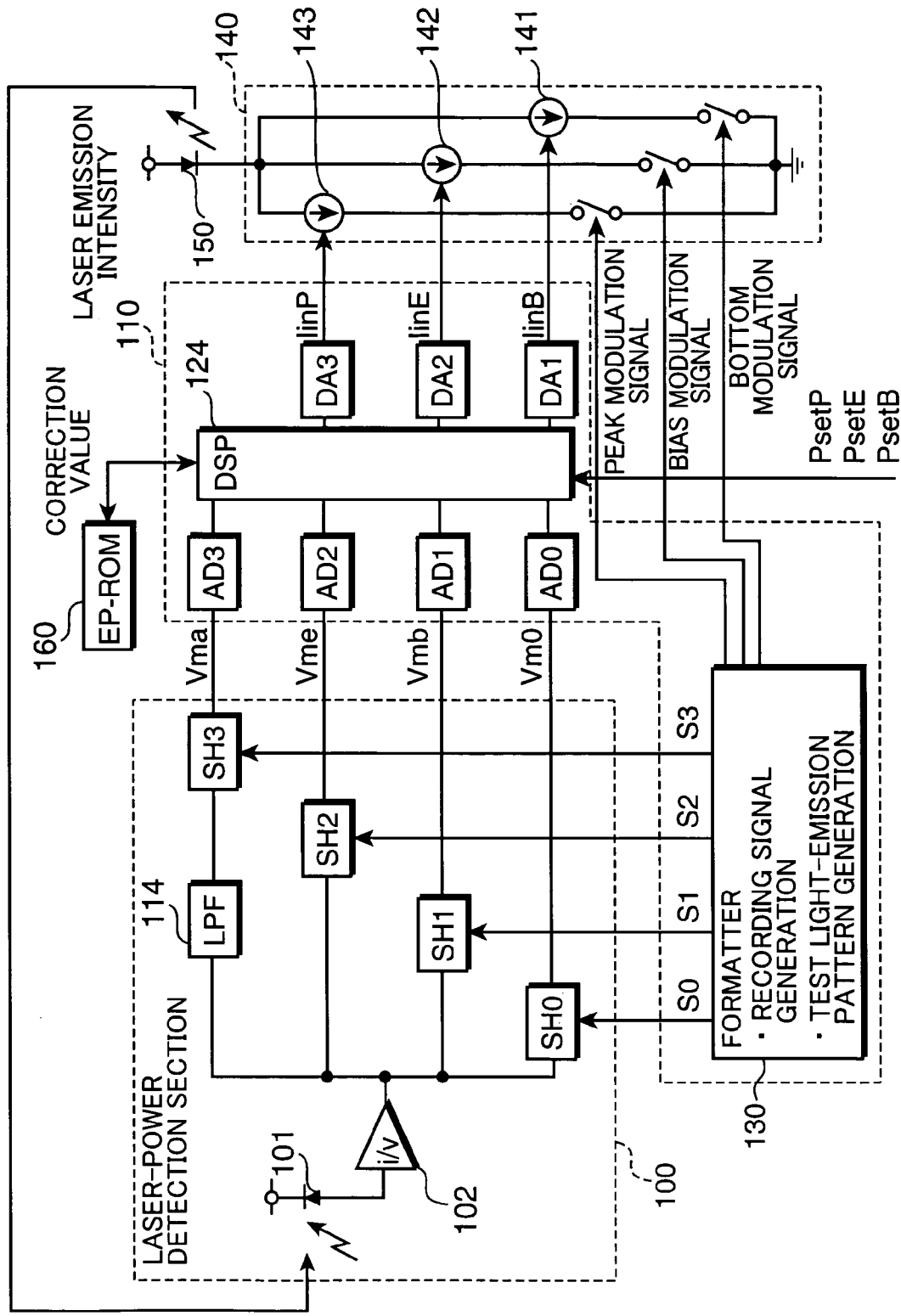
FIG. 1 is a block diagram, showing the configuration of a laser control unit according to a first embodiment of the present invention.
Figure 2:
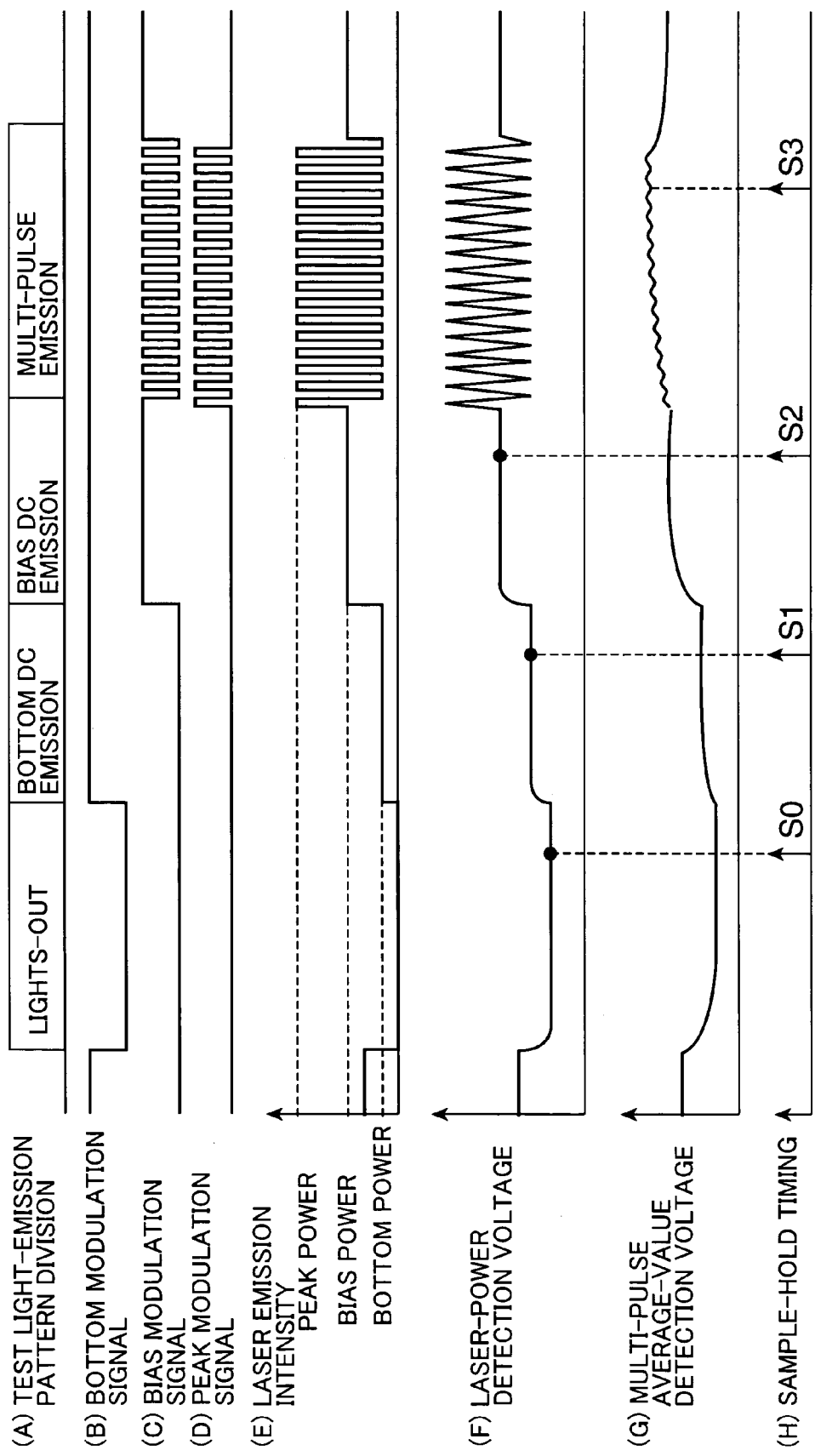
FIG. 2 is a graphical representation, showing an operational sequence of the laser control unit according to the first embodiment of the present invention.

FIG. 1 is a block diagram, showing the configuration of a laser control unit according to an embodiment of the present invention. FIG. 2 is a graphical representation, showing an operational sequence of a laser control unit according to a first embodiment of the present invention. Herein, each section in FIG. 1 is described, using the operational-sequence graphs in FIG. 2.

The laser control unit shown in FIG. 1 is configured by: a laser-power detection section 100; a laser control circuit 110; a laser drive circuit 140; a semiconductor laser 150; and an EP-ROM 160.

First, the algorithm of laser control is described. The laser control unit according to the present invention calibrates the power of a laser in a laser-control area provided on a recording track when executing ordinal recording in an optical disk. In the laser-control area, a specific light-emission pattern is outputted, and then, the relation (i.e., the I-L characteristic of a laser) between a laser drive current and a light-emission power is calculated. Then, the laser drive current is updated (hereinafter, this operation is referred to as the "test light-emission") so that the laser's light-emission power becomes a desired value. As shown in FIG. 2(A), the test light-emission is made up of: an interval in which the laser's light is turned off; an interval in which a DC light emission is executed at a bottom power; an interval in which a DC light emission is executed at a bias power; and an interval in which a multi-pulse light emission is executed between a peak power and the bottom power.

When a recording operation is executed, as a desired value of light-emission power, a command for a peak-power set value PsetP, a bias-power set value PsetE and a bottom-power set value PsetB is given to an arithmetic processor (e.g., a DSP: Digital Signal Processor) 124. Through the calibration of laser power when started or the like, the arithmetic processor 124 obtains in advance substantially the laser's I-L characteristic. The laser's I-L characteristic is expressed approximately as a linear function in the following expression (1). Herein, the variable of power is y, and the variable of an electric current is x.

$$y = \eta 0 \times x + b0 \quad (1)$$

Therefore, a bottom current value IB, a bias current value IE and a peak current value IP are calculated in the following expressions (2) to (4), respectively.

$$IB = (PsetB - b0)/\eta 0 \quad (2)$$

$$IE = (PsetE - b0)/\eta 0 \quad (3)$$

$$IP = (PsetP - b0)/\eta 0 \quad (4)$$

Based upon the result of these calculations, an electric current is calculated which is inputted in each electric-current source of the laser drive circuit 140. The laser drive circuit 140 is designed to add up electric currents which are outputted from electric-current sources 141, 142, 143. Thus, an electric-current value IinB which is inputted in the bottom current source 141, an electric-current value IinE which is inputted in the bias current source 142 and an electric-current value IinP which is inputted in the peak current source 143 are calculated in the following expressions (5) to (7), respectively.

$$IinB = IB \quad (5)$$

$$IinE = IE - IB \quad (6)$$

$$IinP = IP - IE \quad (7)$$

These current values IinB, IinE and IinP which are inputted in the laser drive circuit 140 are converted into an analog electric-current value by DA converters DA1, DA2 and DA3, respectively. Then, they are inputted in the laser drive circuit 140.

In the test light-emission, in the interval where the laser's light is turned off, all of a peak modulation signal (see FIG. 2(D)), a bias modulation signal (see FIG. 2(C)) and a bottom modulation signal (see FIG. 2(B)) of the laser drive circuit 140 become OFF. Thus, the electric current for driving the laser 150 is zero. In the DC emission interval of bottom power, only the bottom modulation signal is turned on. Thereby, the laser drive current becomes the bottom current value IB, so that a light emission is executed at the bottom power. In the DC emission interval of bias power, the bottom modulation signal and the bias modulation signal are turned on. Thereby, the laser drive current becomes the bias current value IE which is obtained by adding together an electric current which is outputted from the bias current source 142 and an electric current which is outputted from the bottom current source 141. Thus, a light emission is executed at the bias power. In the multi-pulse emission interval, the bottom modulation signal is constantly turned on, while the bias modulation signal and the peak modulation signal are repeatedly turned on and off in pulse form. If the bias modulation signal and the peak modulation signal are turned on, the laser drive current becomes the peak current value IP which is obtained by adding up an electric current which is outputted from the peak current source 143, an electric current which is outputted from the bias current source 142 and an electric current which is outputted from the bottom current source 141. Thus, a light emission is executed at the peak power. On the other hand, if the bias modulation signal and the peak modulation signal are turned off, the laser drive current becomes the bottom current value IB. Thus, a light emission is executed at the bottom power. This operation realizes a multi-pulse emission in which the peak power is switched to the bottom power, and vice versa. The above described process is executed in the test light-emission, so that such an optical pulse as shown in FIG. 2(E) can be generated.

The generated optical pulse is detected by the laser-power detection section 100. The laser-power detection section 100 is made up of: a light-receiving element 101; a current-voltage conversion circuit (or i/v) 102; sample-hold circuits SH0, SH1, SH2, SH3; and a low-pass filter (or LPF) 114. When receiving a laser beam, the light-receiving element 101 outputs laser power as an electric current. This electric current outputted by the light-receiving element 101 is converted, as shown in FIG. 2(F), into a voltage value by the current-voltage conversion circuit 102.

As shown in FIG. 2(H), in the interval where the light is turned off, the sample-hold circuit SH0 holds the output voltage of the current-voltage conversion circuit 102, based upon a sample-hold signal S0 which is outputted from a formatter 130. Then, it outputs a 0 mW-level detection voltage Vm0 to an AD converter AD0. Thereafter, in the bottom-power emission interval, the sample-hold circuit SH1 holds the output voltage of the current-voltage conversion circuit 102, based upon a sample-hold signal S1 which is outputted from the formatter 130. Then, it outputs a bottom-power detection voltage Vmb to an AD converter AD1. Thereafter, in the bias-power emission interval, the sample-hold circuit SH2 holds the output voltage of the current-voltage conversion circuit 102, based upon a sample-hold signal S2 which is outputted from the formatter 130. Then, it outputs a bias-power detection voltage Vme to an AD converter AD2. Thereafter, in the multi-pulse emission interval, the output voltage of the current-voltage conversion circuit 102 undergoes a band limitation in the low-pass filter 114. Thereby, such a voltage as shown in FIG. 2(G) is obtained which corresponds to the average value of the multi-pulse emission. The sample-hold circuit SH3 holds the voltage obtained in this way which corresponds to the average value of the multi-pulse emission, based upon a sample-hold signal S3 which is outputted from the formatter 130. Then, it outputs a multi-pulse average-value detection voltage (i.e., multi-pulse average value) Vma to an AD converter AD3.

The 0 mW-level detection voltage Vm0, bottom-power detection voltage Vmb, bias-power detection voltage Vme and multi-pulse average-value detection voltage Vma which have been obtained in the laser-power detection section 100, are converted into a digital value by the AD converters AD0, AD1, AD2, AD3, respectively.

Sequentially, using the 0 mW-level detection voltage Vm0, the bottom-power detection voltage Vmb, bias-power detection voltage Vme and multi-pulse average-value detection voltage Vma which have been converted into a digital value, are converted into a power value by subtracting an offset of the laser-power detection section 100 in the arithmetic processor 124. Specifically, a bottom detection power PmonB, a bias detection power PmonE and a multi-pulse average detection power PmonA are calculated, using the following expressions (8) to (10), respectively.

$$PmonB = Vmb - Vm0 \tag{8}$$

$$PmonE = Vme - Vm0 \tag{9}$$

$$PmonA = Vma - Vm0 \tag{10}$$

In the following process, the arithmetic processor 124 calculates the laser's I-L characteristic at this point of time, and then, controls the laser drive current so that a light emission can be executed at a desired laser power. Based upon the bottom detection power PmonB, the bias detection power PmonE, and the bias current value IE and bottom current value IB at the time of the test light-emission, the laser's I-L characteristic between the bottom power and the bias power is approximately expressed in the following expression (11).

$$y = \eta 1 \times x + b1 \tag{11}$$

Herein, η1, b1 are expressed in the following expressions (12), (13), respectively.

$$\eta 1 = (PmonE - PmonB)/(IE - IB) \tag{12}$$

$$b1 = (PmonB \times IE - PmonE \times IB)/(IE - IB) \tag{13}$$

In addition, based upon the multi-pulse average detection power PmonA and the bottom detection power PmonB, the arithmetic processor 124 calculates a peak detection power PmonP in the following arithmetic operations. If the duty of the multi-pulse segment is d, the peak detection power PmonP is calculated in the following expression (14).

$$PmonP = (PmonA - PmonB \times (1-d))/d \tag{14}$$

Then, using the relation between the detection powers PmonP, PmonB and the drive electric-current values Ip, IB, the laser's I-L characteristic is approximately expressed in the following expression (15).

$$y = \eta 2 \times x + b2 \tag{15}$$

Herein, η2, b2 are expressed in the following expressions (16), (17), respectively.

$$\eta 2 = (PmonP - PmonB)/(IP - IB) \tag{16}$$

$$b2 = (PmonB \times IP - PmonP \times IB)/(IP - IB) \tag{17}$$

Based upon these arithmetic results, the laser's drive current is controlled as described below. Herein, the target power values for the control of bottom power, bias power and peak power, which are used in arithmetic operations, are designated as PrefB, PrefE and PrefP, respectively. If these target power values are equal to the values which are commanded by the arithmetic processor 124, they are expressed in the following expressions (18) to (20), respectively.

$$PrefB = PsetB \tag{18}$$

$$PrefE = PsetE \tag{19}$$

$$PrefP = PsetP \tag{20}$$

Therefore, the bottom current value IB, bias current value IE and peak current value IP are calculated in the following expressions (21) to (23), respectively.

$$IB = (PrefB - b1)/\eta 1 \tag{21}$$

$$IE = (PrefE - b1)/\eta 1 \tag{22}$$

$$IP = (PrefP - b2)/\eta 2 \tag{23}$$

Thus, the electric-current value IinB, IinE and IinP which are inputted in the electric-current sources 141, 142, 143 from the arithmetic processor 124, are updated in the following expressions (24) to (26), respectively.

$$IinB = IB \tag{24}$$

$$IinE = IE - IB \tag{25}$$

$$IinP = IP - IE \tag{26}$$

Using the above described process, the laser's power is controlled.

Figure 3:
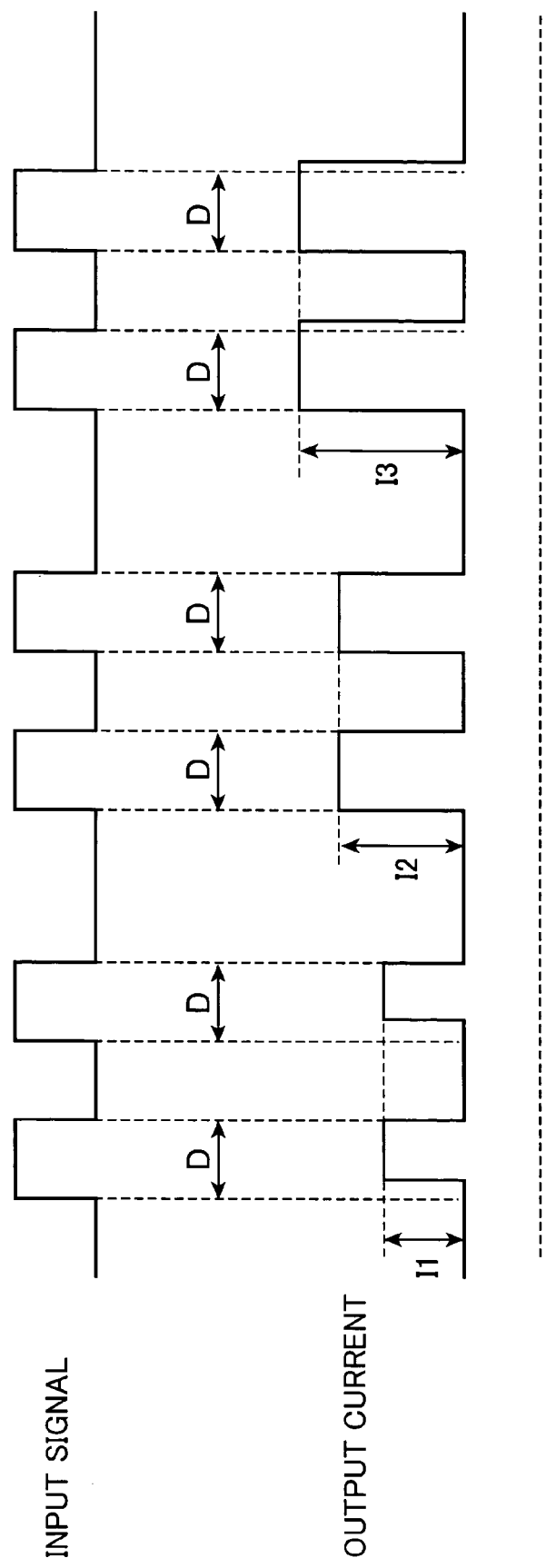
FIG. 3 is a typical representation, showing that the duty of an output electric-current depends upon a pulse electric-current value of a laser drive circuit, and becomes shifted from it.
Figure 4:
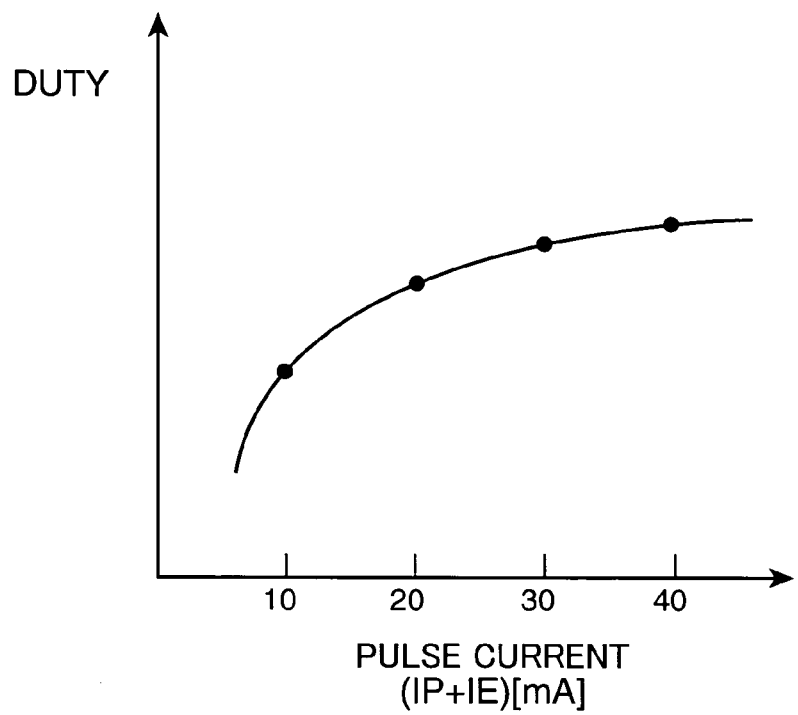
FIG. 4 is a graphical representation, showing a characteristic of an output duty with respect to a pulse electric-current.

In this method, however, based on the average value of the multi-pulse segment, a peak power is calculated using a set duty. Therefore, if the set duty is shifted from the light-emission duty, an error is produced when the peak power is calculated. As shown in FIG. 3, it has been found out that, because of a characteristic of the laser drive circuit 140, if the crest value of an output pulse current is changed, the duty of the output pulse current varies according to this pulse current's crest value. This takes place, even if the peak modulation signal and the bias modulation signal are inputted in pulse form at a fixed duty. Consequently, the duty of an optical pulse may be changed. As shown in FIG. 4, for example, the duty of an output current of the laser drive circuit 140 has a component which is proportional to the reciprocal of the output current. While the optical pulse's duty varies according to the set duty, the arithmetic processor 124 calculates a peak power, using the set duty. This presents a disadvantage in that an error may be produced in the peak power.

Figure 5:
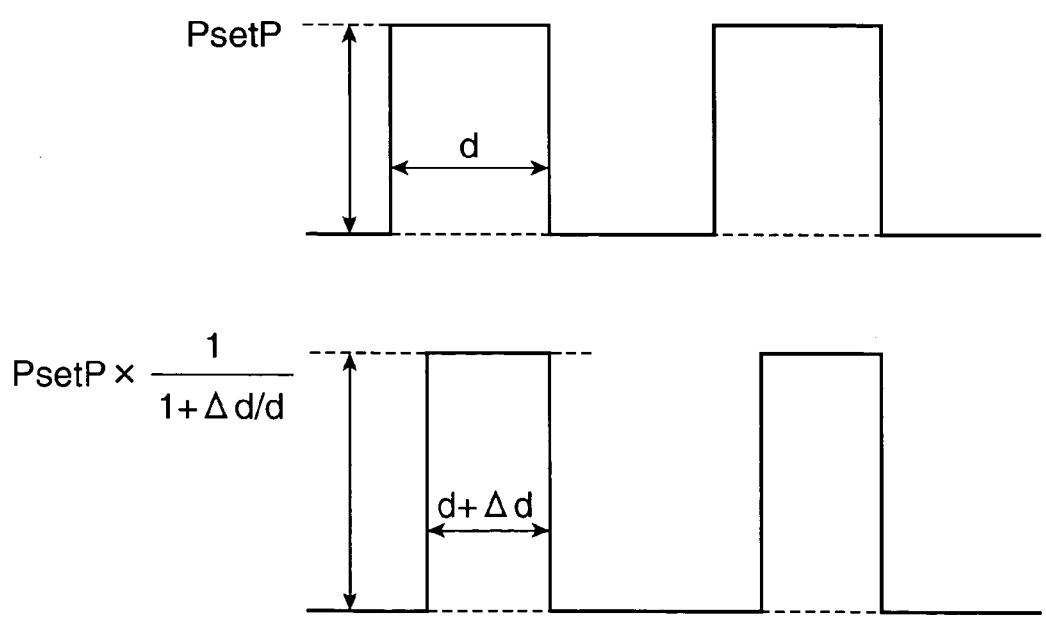
FIG. 5 is a representation, showing a peak-power control error in the case where there is the duty's discrepancy.

Herein, how the peak power is shifted will be described using a model, with reference to FIG. 5. In order to describe it simply, the bottom power is assumed to be 0 mW. If the peak-power set value is PsetP and the set duty is d, the average value of the optical pulse becomes PsetP×d. On the other hand, in the case where a duty variation rate is Δd when there is the duty's discrepancy, if the peak power which is controlled in an arithmetic operation is P, the average value of the optical pulse becomes P×d (1+Δd). In the above described control algorithm, the peak power is controlled so that the average value of the optical pulse becomes PsetP×d, which is expressed in the following.

$$P \times d(1+\Delta d) = PsetP \times d$$

Thereby, the following expression is obtained.

$$P = PsetP \times 1/(1+\Delta d/d)$$

Figure 6A:
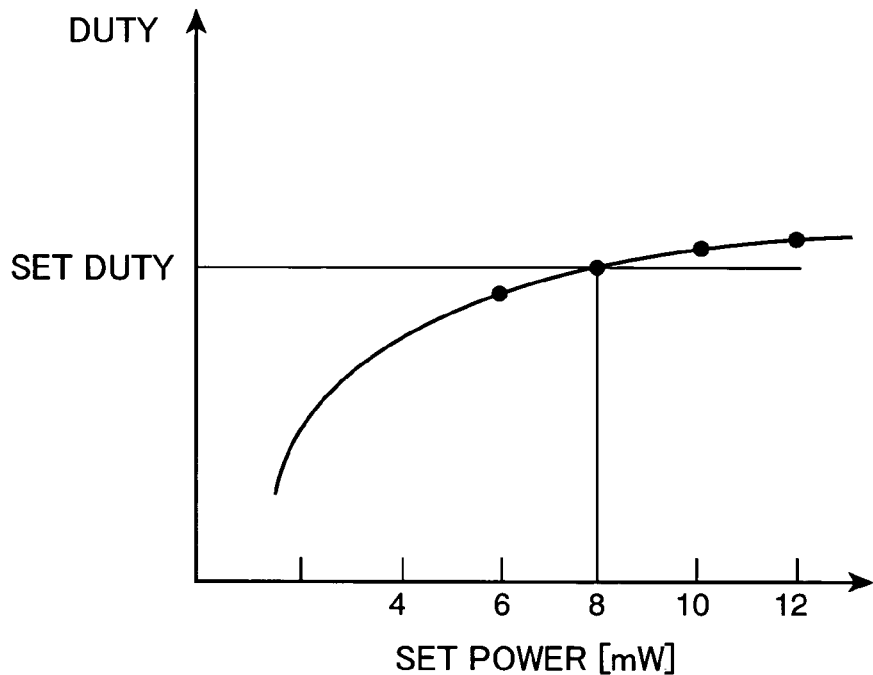
FIG. 6A is a graphical representation, showing a characteristic of the duty of an optical pulse with respect to a set power.
Figure 6B:
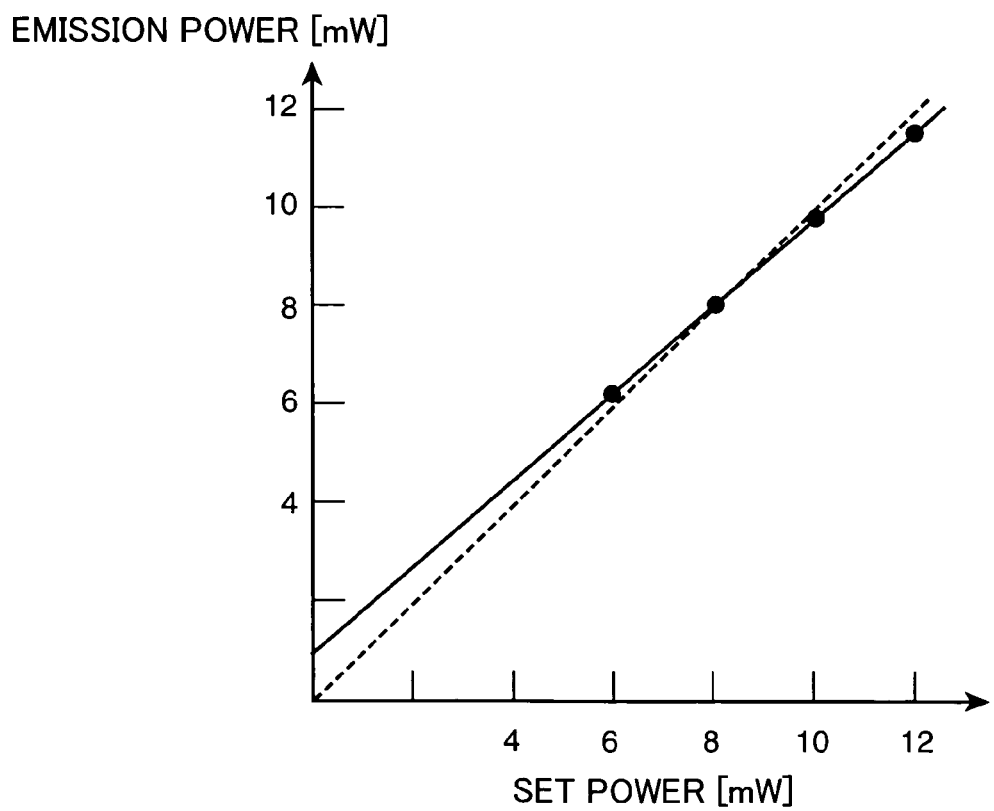
FIG. 6B is a graphical representation, showing the relation between a set power and a light-emission power.

As a result, an error is produced by 1/(1+Δd/d) times, compared at the peak power set value. For example, the optical pulse is assumed to have such a duty characteristic as shown in FIG. 6A. Specifically, if the peak-power set value is 8 mW, its duty becomes equal to the set duty. If the peak-power set value is less than 8 mW, it goes down. In contrast, if the peak-power set value is more than 8 mW, it goes up. In this case, as shown in FIG. 6B, the peak power which is controlled using the above described control algorithm becomes equal to the set one, if the peak-power set value is 8 mW. However, if the peak-power set value is less than 8 mW, it increases, and if the peak-power set value is more than 8 mW, it decreases.

It has been found out that, if the duty of an optical pulse with respect to a set power has a component which is substantially inversely proportional to the reciprocal of the set power, the relation of light-emission power to the set power has a characteristic in which an offset is added to its ideal straight line, and thus, the gradient becomes gentle. Using this characteristic, the relation of the light-emission power to the set power is obtained by varying the set power from the low level to the high level. This presents a method of correcting the light-emission power.

Figure 7:
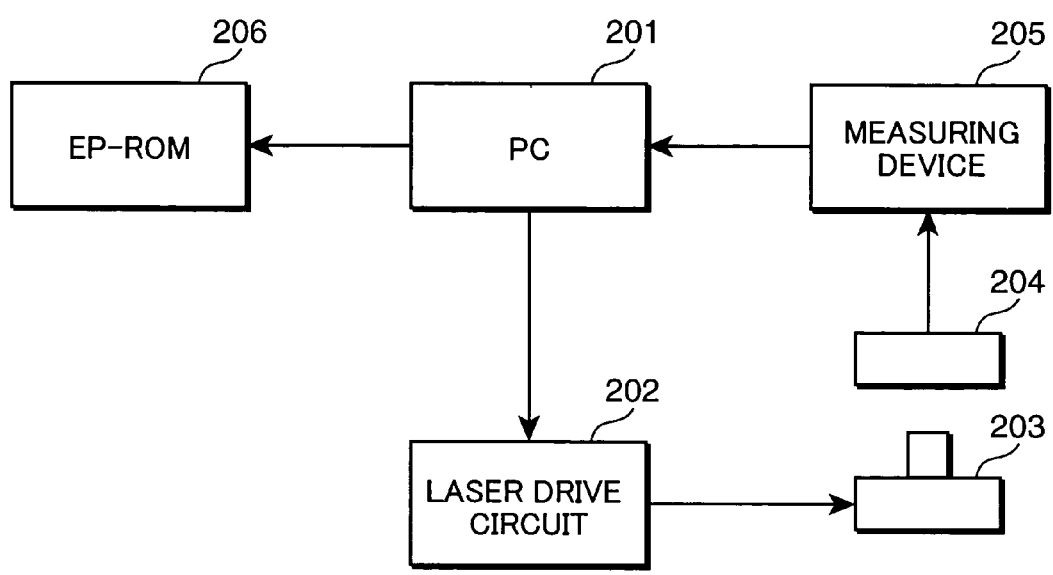
FIG. 7 is a block diagram, showing a laser-power adjustment unit which calculates a correction value for correcting a light-emission power discrepancy according to the first embodiment of the present invention.
Figure 8:
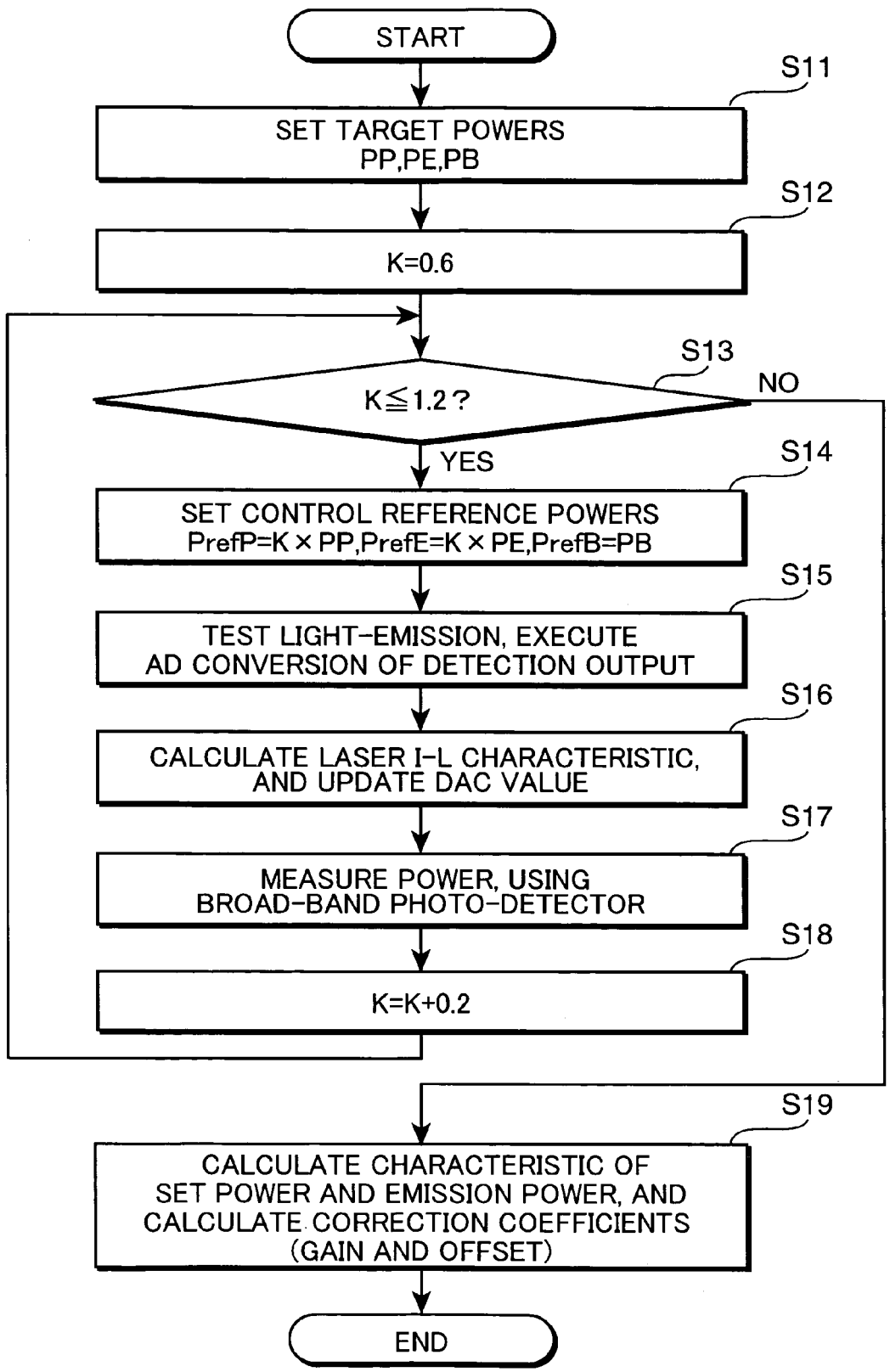
FIG. 8 is a flow chart for obtaining the relation between a set power and a light-emission power according to the first embodiment of the present invention.

Hereinafter, such a method will be described in detail. FIG. 7 is a block diagram, showing a laser-power adjustment unit which calculates a correction value for correcting a light-emission power discrepancy according to the first embodiment of the present invention. FIG. 8 is a flow chart, showing an operation in which the correction value is calculated for correcting a light-emission power discrepancy, using the laser-power adjustment unit shown in FIG. 7. The first embodiment of the present invention is implemented, for example, when a manufacturing process is adjusted. When such a process is adjusted, the peak power of an optical pulse which is emitted from an objective lens of an optical head is measured, using a broad-band photo-detector.

The laser-power adjustment unit shown in FIG. 7 is configured by: a PC (or personal computer) 201; a laser drive circuit 202; a laser 203; a photo-detector 204; a measuring device 205; and an EP-ROM 206.

The PC 201 is made up of: an ROM (or read-only memory) which stores a control program for the laser-power adjustment unit; an RAM (or random-access memory) which stores data temporarily; a CPU (or central processing unit) which reads and executes the control program or the like from the ROM; and the like. The PC 201 calculates a correction value, using a laser-power adjustment method described below, and then, it stores, in the EP-ROM 206, the correction value it has calculated.

The laser drive circuit 202 drives the laser 203, based on a peak modulation signal, a bias modulation signal and a bottom modulation signal which are inputted from the PC 201. The laser 203 is driven by the laser drive circuit 202. It generates (and outputs) a beam of light which is made up of: an interval in which the laser's light is turned off; an interval in which a DC light emission is executed at a bottom power; an interval in which a DC light emission is executed at a bias power; and an interval in which a multi-pulse light emission is executed between peak power and bottom power.

The photo-detector 204 receives a beam of light which is outputted from the laser 203, and then, outputs, to the measuring device 205, an electric signal according the intensity of the light it has received.

The measuring device 205 is made up, for example, of an oscilloscope and the like. It generates a waveform from an analog electric signal which is outputted from the photo-detector 204, and then, outputs it to the PC 201.

The EP-ROM 206 stores a correction value which is calculated by the PC 201, in the same way as the EP-ROM 160 shown in FIG. 1.

With respect to a peak power which is used for ordinal data recording, the power which is used for the most suitable recording power adjustment or the like is usually within a range of 0.6 to 1.2 times as great. For example, if the peak power which is used for ordinal data recording is 10 mW, the range of the power which is practically used for the most suitable recording power adjustment or the like in an optical recording regeneration unit, is from 6 mW to 12 mW. Therefore, within this range, a correction value is calculated so that light-emission power can be obtained which is identical with a set power.

In FIG. 8, first, a peak power, a bias power and a bottom power which are used for ordinal data recording are defined as PP, PE and PB, respectively (in a step S11). Next, the flow of steps S12 to S14 is executed, so that a set power becomes 0.6PP, 0.6PE and PB. In other words, a coefficient K is set at 0.6 (in the step S12). Next, a decision is made whether or not the coefficient K is 1.2 or less (in a step S13). Herein, if the decision is made that the coefficient K is 1.2 or less (i.e., YES at the step S13), then the processing goes to a step S14. On the other hand, if the decision is made that the coefficient K is more than 1.2 (i.e., NO at the step S13), then the processing jumps to a step S19. If the decision is made that the coefficient K is 1.2 or less, control reference powers (i.e., the target power values) PrefP, PrefE and PrefB are set at K×PP, K×PE and PB, respectively (in the step S14). Specifically, if the coefficient K is set at 0.6, the control reference powers PrefP, PrefE and PrefB are set at 0.6PP, 0.6PE and PB, respectively. Next, by the above described laser control method, an optical pulse is generated in the test light-emission. Then, the detection value of each power is subjected to an AD conversion (in a step S15). The PC 201 calculates the I-L characteristic of a laser, using the above described control algorithm. Then, it updates a DAC (or digital-analogue converter) value (in a step S16). The peak power which has been controlled at this time is measured, using the broad-band photo-detector 204 (in a step S17).

Next, 0.2 is added to the coefficient K, and the processing returns to the step S13 (in a step S18). Then, the processing of the step S18 and the steps S14 to S17 is repeated. Thereby, the set peak power and the bias power are each changed, such as 0.8, 1, 1.2 times as great as PP and PB. Then, the peak power which has been controlled at that time is measured, using the broad-band photo-detector 204. If the decision is made that the coefficient K is more than 1.2, then based on the obtained measured value, the relation of light-emission peak power measured by the broad-band photo-detector 204 to the set power is obtained (in the step S19).

If the obtained relation of the light-emission power to the set power is expressed approximately as a linear function, an offset is added to substantially the ideal straight line, and thus, the gradient becomes gentle. At this time, the offset quantity is set as ofs and the gradient is set as grad. Then, these values are stored in the EP-ROM 206.

As described above, a target power value of an optical pulse is set, then a predetermined optical pulse is generated based on the set target power value, and a photo-detection signal is obtained by converting the generated optical pulse into an electric signal. Next, the difference between the obtained photo-detection signal and the target power value of the optical pulse is calculated, and then, based on this difference, control is executed so that an electric-current value which passes through a semiconductor laser becomes equivalent to the target power value. Sequentially, a light-emission power value of the controlled optical pulse is measured using the photo-detector 204. Then, an increment of the target power value of the optical pulse is executed, so that the target power value of the optical pulse is set again. This processing is repeated, and thus, the relation between the target power value and the light-emission power value is calculated as a correction value. Then, the calculated correction value is stored beforehand in the EP-ROM 206. Using this correction value, the laser power can be controlled more precisely.

When a light emission of recording power is practically executed, with respect to the designated peak-power set value PsetP, the target power value PrefP of peak power which is used in an arithmetic operation is calculated in the following expression (27).

$$PrefP=(PsetP-ofs)/grad \qquad (27)$$

Even in the case where the duty of an optical pulse is shifted from a set duty, and in addition, the duty's discrepancy depends upon the crest value (or peak value) of a pulse current for driving a laser, if the above described correction is executed, the laser power can be controlled more precisely.

Furthermore, in the EP-ROM 160, the relation between the target power value and the light-emission power value is expressed approximately as a linear function in advance, and the intercept and gradient of the approximate linear function are stored as the correction value. Thus, the DSP 124 corrects the target power value, based on the correction value stored in the EP-ROM 160. Then, the DSP 124 executes an arithmetic operation of the difference between the corrected target power value and the light-emission power value, and then, controls the electric-current value which is supplied to the semiconductor laser, based on the obtained difference. Finally, the laser drive circuit 140 drives the semiconductor laser 150, based on the electric-current value which is controlled by the DSP 124.

Hence, the relation between the target power value and the light-emission power value is expressed approximately as a linear function in advance, and the intercept and gradient of the approximate linear function are stored beforehand as the correction value. Therefore, the target power value can be easily corrected, thus controlling the laser extremely precisely.

Herein, the relation of the light-emission power to the set power may also be stored as a table in the EP-ROM 160. In that case, the set power which corresponds to a desired peak power becomes the target power value PrefP of peak power which is used in an arithmetic operation. This presents the same advantage.

Moreover, the relation of the light-emission power to the set power may also be replaced with the relation of the light-emission power to a pulse current for driving a laser. In that case, such a relation is obtained, then the offset quantity and the gradient are stored in the EP-ROM 160, and the pulse current is corrected. Or, the relation of the light-emission power to the pulse current is stored as a table in the EP-ROM 160, and thus, the pulse current is corrected.

Hence, the light-receiving element 101 converts the optical pulse generated by the semiconductor laser 150 into an electric signal, and then, outputs a photo-detection signal. Then, the low-pass filter 114 calculates the average value of the optical pulse, based on the photo-detection signal outputted by the light-receiving element 101. Next, the DSP 124 executes an arithmetic operation of the light-emission power value, based on the average value of the optical pulse calculated by the low-pass filter 114 and the duty of the optical pulse, and then, calculates the difference between the light-emission power value and a reference value which corresponds to the target power value. In the EP-ROM 160, a correction value is stored which is used to correct an arithmetic operation which is executed by the DSP 124. Thus, the DSP 124 corrects the arithmetic operation, based on the correction value stored in the EP-ROM 160. Sequentially, the DSP 124 controls the electric-current value which is supplied to the semiconductor laser, based on the corrected arithmetic result. Finally, the laser drive circuit 140 drives the semiconductor laser 150, based on the electric-current value controlled by the DSP 124.

Therefore, even if the duty of an optical pulse is shifted from a preset duty, the peak value of the optical pulse can be precisely controlled. This makes it possible to control the laser power more precisely.

Figure 9:
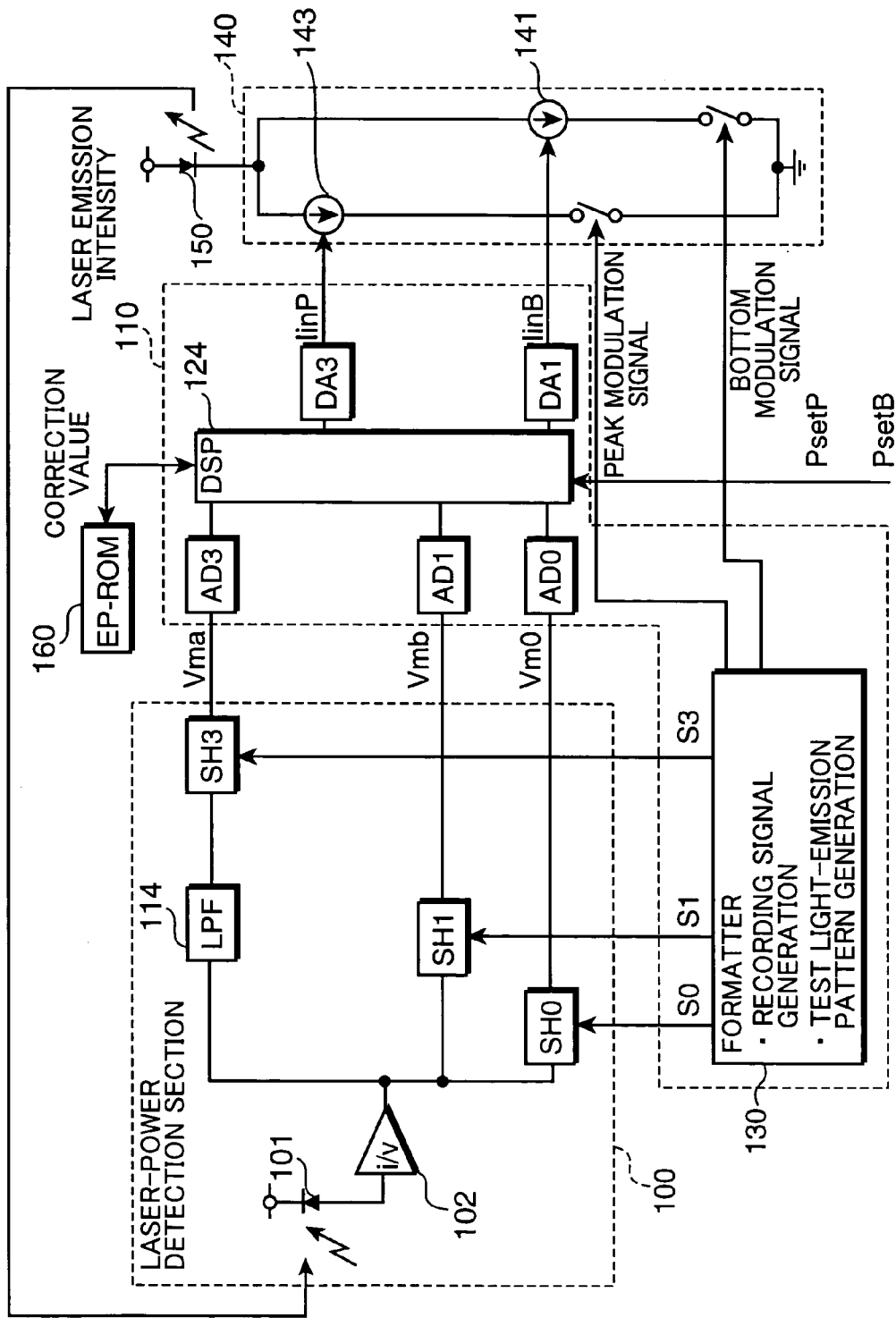
FIG. 9 is a block diagram, showing the configuration of a laser control unit according to a variation of the first embodiment.
Figure 10:
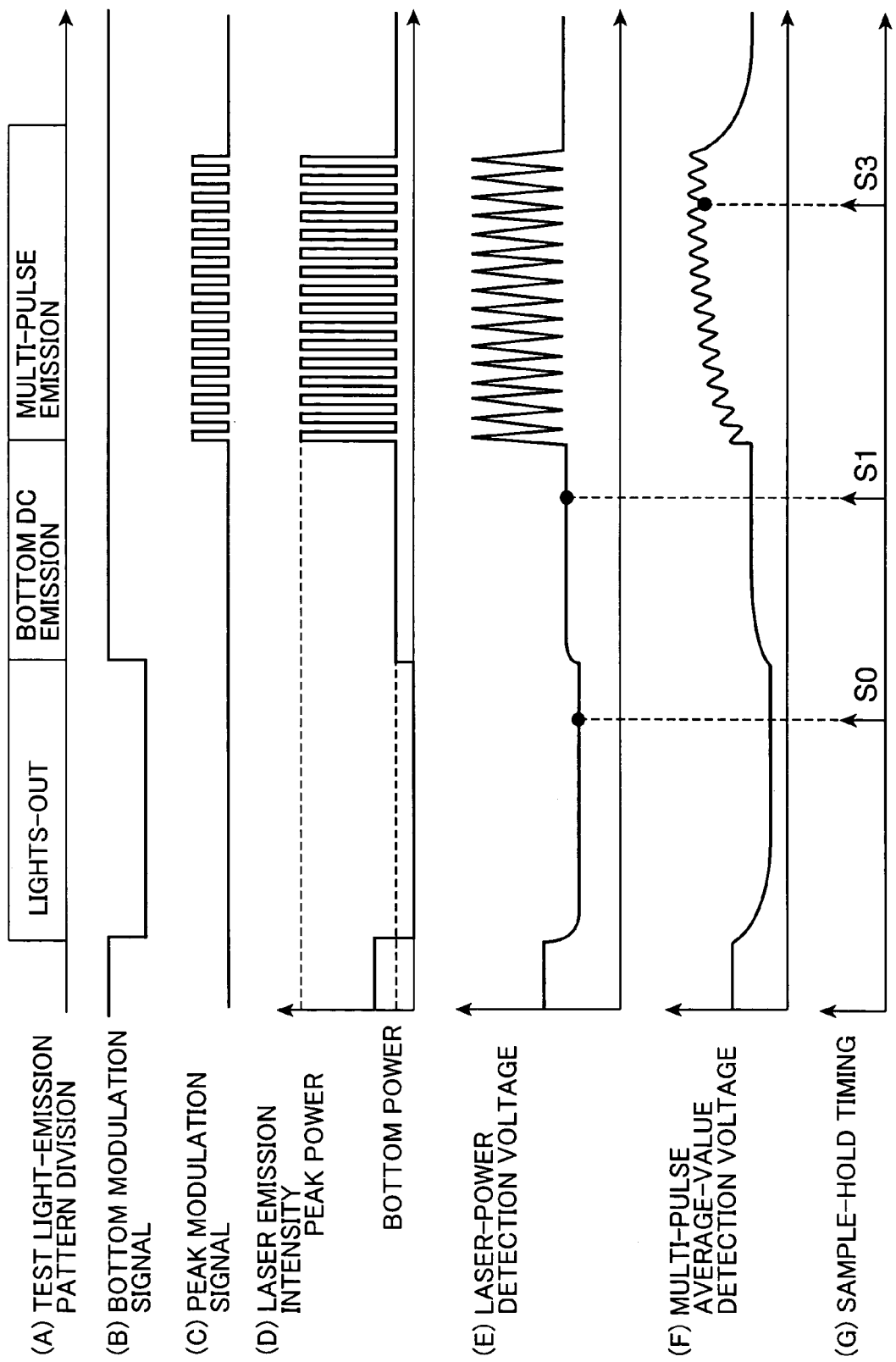
FIG. 10 is a graphical representation, showing an operational sequence of the laser control unit according to the variation of the first embodiment.
Figure 11:
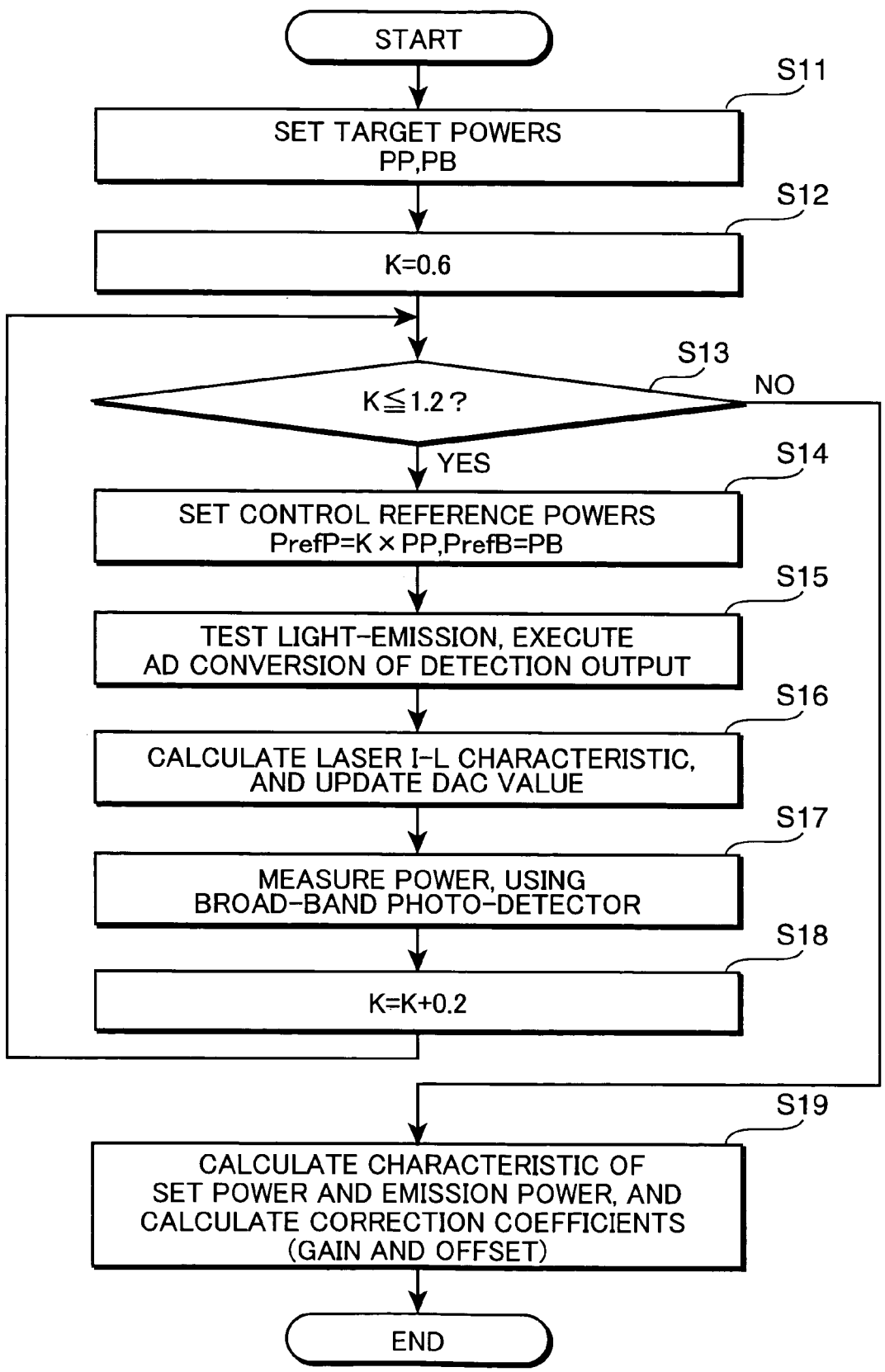
FIG. 11 is a flow chart for obtaining the relation between a set power and a light-emission power according to the variation of the first embodiment.

Furthermore, in this embodiment, recording in a rewritable-type optical disk is taken into account. Thus, the description is given about controlling each power value of an optical pulse which is made up of a peak value, a bottom value and a bias value. However, the present invention is not limited to this. For example, recording in a write-once type optical disk may also be taken into account. In that case, each power value of an optical pulse is controlled which is made up of a peak value and a bottom value. FIG. 9 is a block diagram, showing the configuration of a laser control unit according to a variation of the first embodiment. FIG. 10 is a graphical representation, showing an operational sequence of the laser control unit according to the variation of the first embodiment. FIG. 11 is a flow chart for obtaining the relation between a set power and a light-emission power according to the variation of the first embodiment.

The laser control unit according to the variation of the first embodiment records data in a write-once type optical disk. It controls each power value of an optical pulse which is made up of a peak value and a bottom value. Herein, in FIG. 9, the sample-hold circuit SH2, AD converter AD2, DA converter DA2 and bias current source 142 are not provided, which is different from FIG. 1. However, the other components are the same as those of FIG. 1, and thus, their description is omitted. The operational sequence shown in FIG. 10 is also different from the operational sequence shown in FIG. 2. The former is not provided with an interval in which a DC light emission is executed at a bias power. But, the rest of the operational sequence is the same as that of FIG. 2, and thus, its description is omitted. In addition, in the flow chart shown in FIG. 11, the bias DC emission is skipped, which is different from the flow chart shown in FIG. 8. However, the other processing is the same as that of FIG. 8, and thus, its description is omitted.

Figure 12:
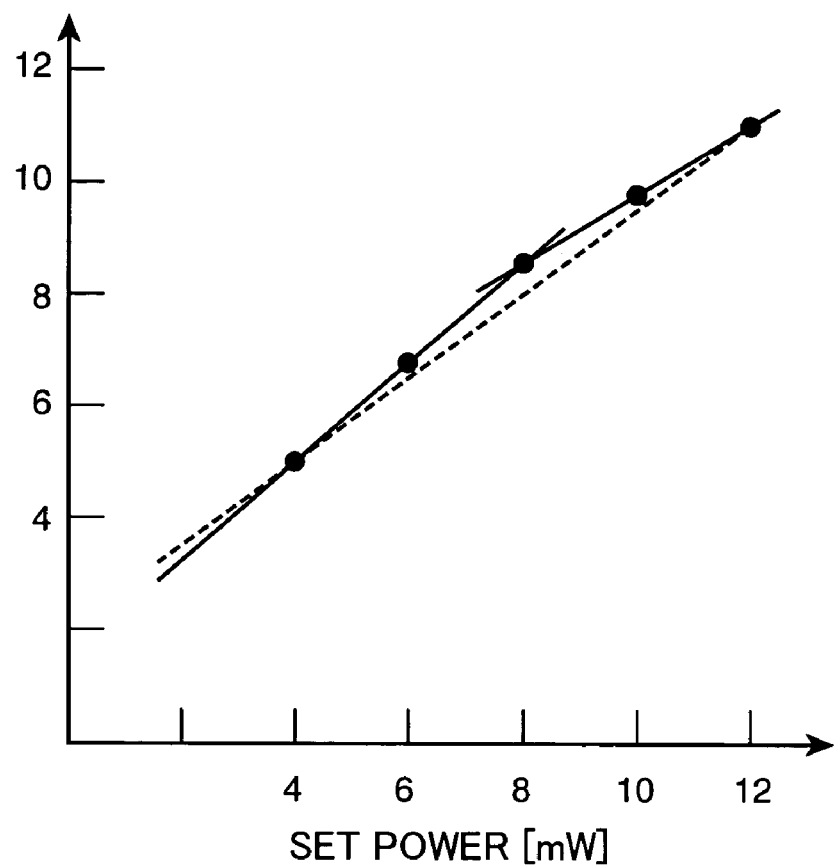
FIG. 12 is a graphical representation, showing the relation between a set power and a light-emission power according to the variation of the first embodiment.

Herein, in this embodiment, the relation between the set power and the light-emission power is expressed approximately as a single linear function. However, the present invention is not limited to this embodiment. As shown in FIG. 12, it may also be expressed approximately as two or more linear functions (i.e., approximate straight lines). In that case, the gradient of each approximate straight line and an offset are stored as a correction value in the EP-ROM 160. This makes it possible to execute such a correction more precisely.

Second Embodiment

A second embodiment of the present invention is designed to resolve the problem of the discrepancy between a light-emission power and a set power, without using the broad-band photo-detector used in the first embodiment. In this embodiment, a light-receiving element and a current-voltage conversion circuit which are provided inside of the laser control unit are used as a means for detecting laser power. The duty's discrepancy is obtained, using a peak power detection value in the case where a DC light emission is executed at a peak power and an average value in the case where a multi-pulse light emission is executed at the same electric-current value as that at that time. Then, it is used as a correction value.

Figure 13:
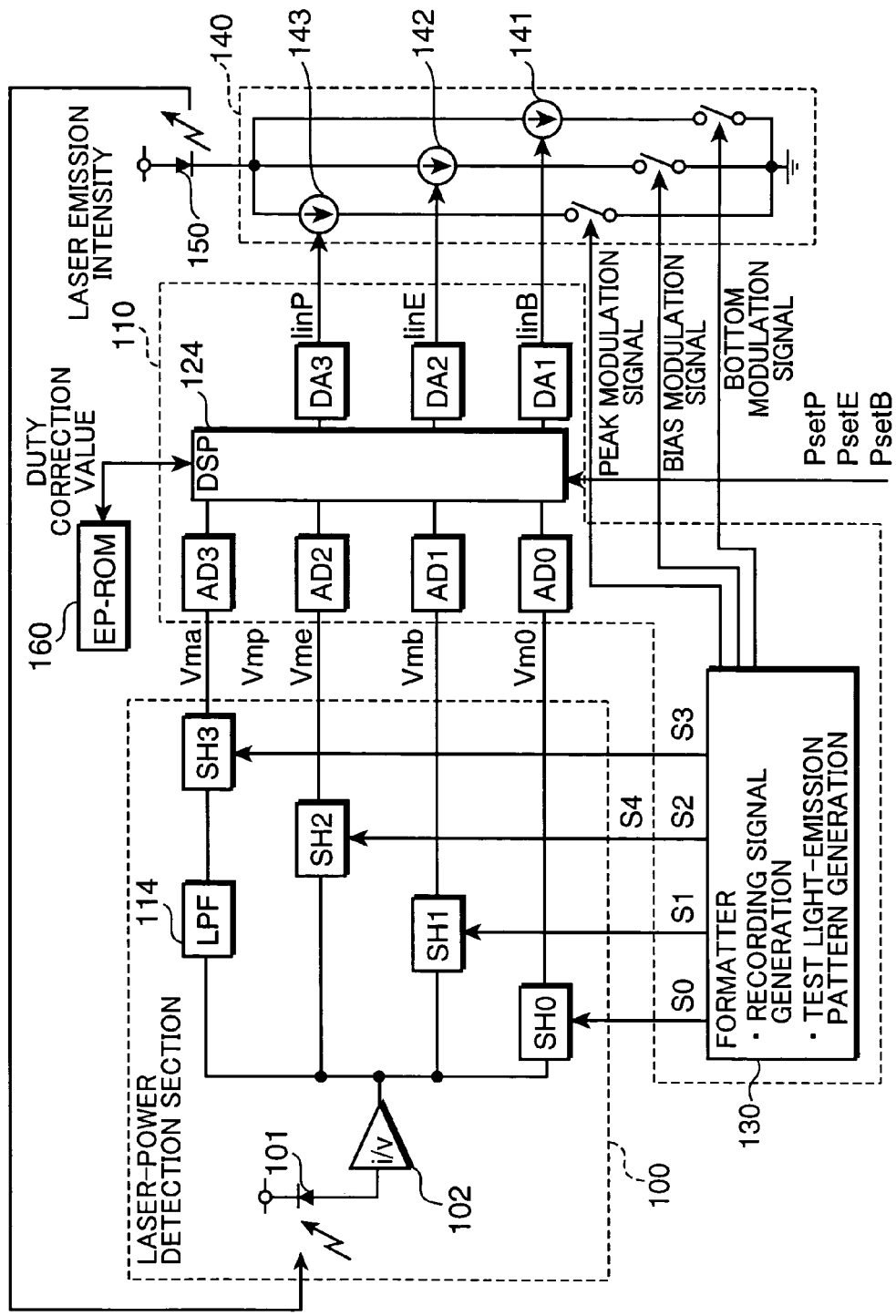
FIG. 13 is a block diagram, showing the configuration of a laser control unit according to a second embodiment of the present invention.
Figure 14:
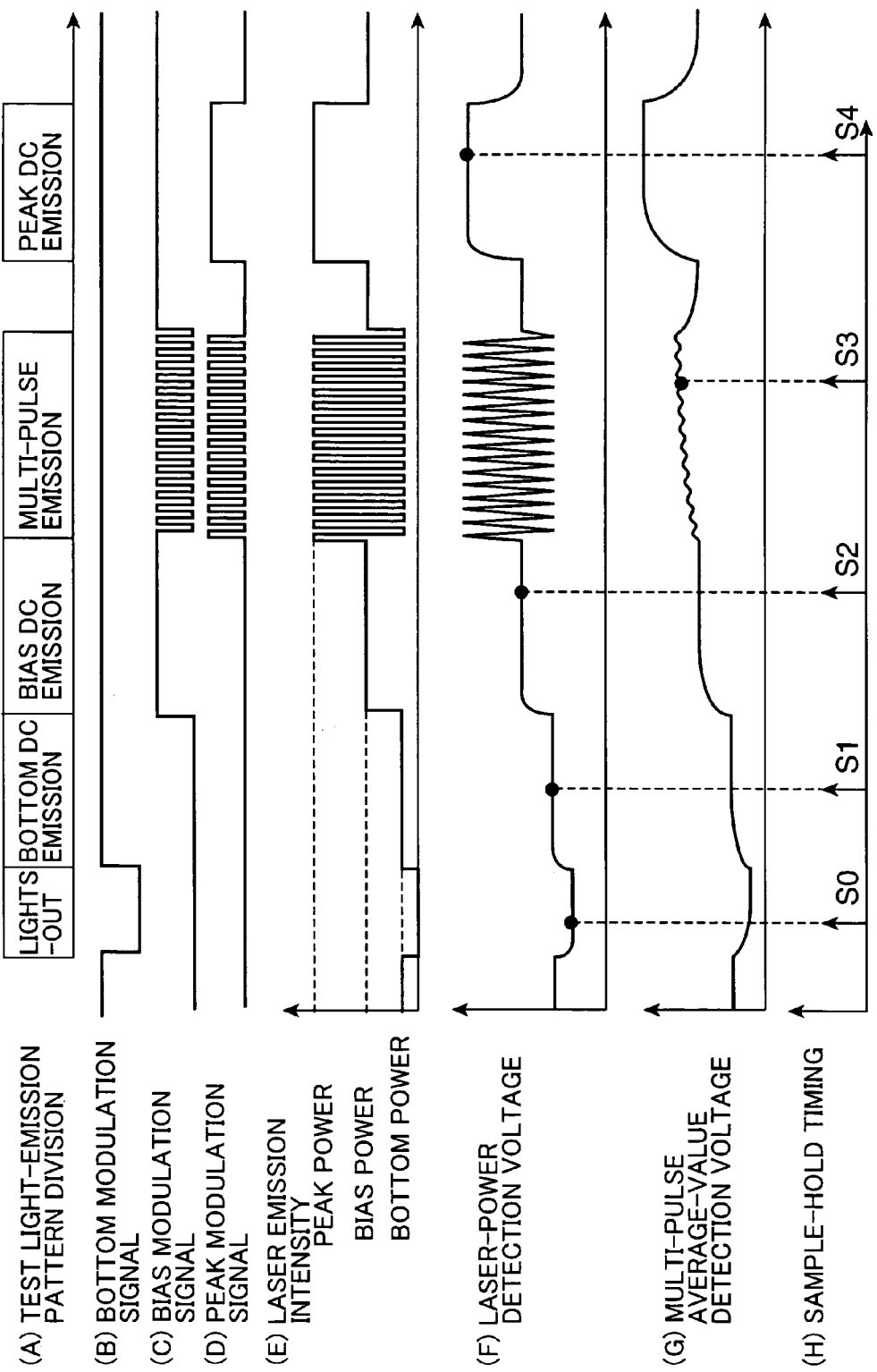
FIG. 14 is a graphical representation, showing an operational sequence of the laser control unit according to the second embodiment of the present invention.

FIG. 13 is a block diagram, showing the configuration of a laser control unit according to the second embodiment of the present invention. FIG. 14 is a graphical representation, showing an operational sequence of the laser control unit according to the second embodiment of the present invention. Herein, only the configuration different from that according to the first embodiment is described below, suitably using the operational sequences in FIG. 14.

First, as the operation of a laser light emission, in addition to such a test light-emission as shown in the first embodiment, an interval in which a DC light emission is executed at a peak power is separately provided as shown in FIG. 14(A). Hence, in the second embodiment, the test light-emission is made up of: an interval in which the laser's light is turned off; an interval in which a DC light emission is executed at a bottom power; an interval in which a DC light emission is executed at a bias power; an interval in which a multi-pulse light emission is executed between the peak power and the bottom power; and an interval in which a DC light emission is executed at the peak power.

A command for the peak-power set value PsetP, the bias-power set value PsetE and the bottom-power set value PsetB is given to the arithmetic processor 124. In the same way as in the first embodiment, the arithmetic processor 124 calculates the bottom current value IB, the bias current value IE and the peak current value IP. Next, it calculates the electric-current value IinB which is inputted in the bottom current source 141, the electric-current value IinE which is inputted in the bias current source 142 and the electric-current value IinP which is inputted in the peak current source 143. Then, it inputs each of them in the laser drive circuit 140. Sequentially, these electric-current values IinB, IinE and IinP which are inputted in the laser drive circuit 140 are converted into an analog electric-current value by the DA converters DA1, DA2 and DA3, respectively. Then, they are inputted in the laser drive circuit 140.

As shown in FIG. 14(A) to 14(E), based on a bottom modulation signal, a bias modulation signal and a peak modulation signal which are inputted in the laser drive circuit 140 from the formatter 130, an optical pulse is generated which contains the laser's lights-out, a DC light emission at the bottom power, a DC light emission at the bias power, a multi-pulse light emission between the peak power and the bottom power and a DC light emission at the peak power.

The optical pulse which has been generated in this process is detected by the laser-power detection section 100. When receiving a laser beam, the light-receiving element 101 outputs laser power as an electric current. This electric current outputted by the light-receiving element 101 is converted, as shown in FIG. 14(F), into a voltage value by the current-voltage conversion circuit 102.

In the interval where the light is turned off, the sample-hold circuit SH0 holds the output voltage of the current-voltage conversion circuit 102, based upon the sample-hold signal S0. Then, it outputs the 0 mW-level detection voltage Vm0. Thereafter, in the bottom-power emission interval, the sample-hold circuit SH1 holds the output voltage of the current-voltage conversion circuit 102, based upon the sample-hold signal S1. Then, it outputs the bottom-power detection voltage Vmb. Thereafter, in the bias-power emission interval, the sample-hold circuit SH2 holds the output voltage of the current-voltage conversion circuit 102, based upon the sample-hold signal S2. Then, it outputs the bias-power detection voltage Vme. Thereafter, in the multi-pulse emission interval, the output voltage of the current-voltage conversion circuit 102 undergoes a band limitation in the low-pass filter 114. Thereby, a voltage is obtained which corresponds to the average value of the multi-pulse emission. The sample-hold circuit SH3 holds the voltage obtained in this way which corresponds to the average value of the multi-pulse emission, based upon the sample-hold signal S3. Then, it outputs the multi-pulse average-value detection voltage Vma.

The 0 mW-level detection voltage Vm0, bottom-power detection voltage Vmb, bias-power detection voltage Vme and multi-pulse average-value detection voltage Vma which have been obtained in the laser-power detection section 100, are converted into a digital value by the AD converters AD0, AD1, AD2, AD3, respectively.

In addition, thereafter, in the peak-power emission interval, the sample-hold circuit SH2 holds the output voltage of the current-voltage conversion circuit 102, based upon the sample-hold signal S4. Then, it outputs a peak-power detection voltage Vmp. This peak-power detection voltage Vmp is converted into a digital value by the AD converter AD2.

Herein, in this embodiment, the sample-hold circuit SH2 outputs the peak-power detection voltage Vmp held based upon the sample-hold signal S4. However, the present invention is not limited especially to this. The following sample-hold circuit and AD converter may also be further provided. Specifically, the sample-hold circuit holds the output voltage of the current-voltage conversion circuit 102, based upon the sample-hold signal S4, and then, outputs the peak-power detection voltage Vmp. The AD converter executes an AD conversion of the peak-power detection voltage Vmp.

Sequentially, using the 0 mW-level detection voltage Vm0, each detection voltage is converted into a power value by subtracting an offset of the laser-power detection section 100 in the arithmetic processor 124. Specifically, the bottom detection power PmonB, the bias detection power PmonE, the multi-pulse average detection power PmonA and the peak detection power PmonP are calculated, using the following expressions (28) to (31), respectively.

$$PmonB = Vmb - Vm0 \tag{28}$$

$$PmonE = Vme - Vm0 \tag{29}$$

$$PmonA = Vma - Vm0 \tag{30}$$

$$PmonP = Vmp - Vm0 \tag{31}$$

The optical pulse's duty d is calculated, using the following expression (32).

$$d = (PmonA - PmonB)/(PmonP - PmonB) \tag{32}$$

Figure 15:
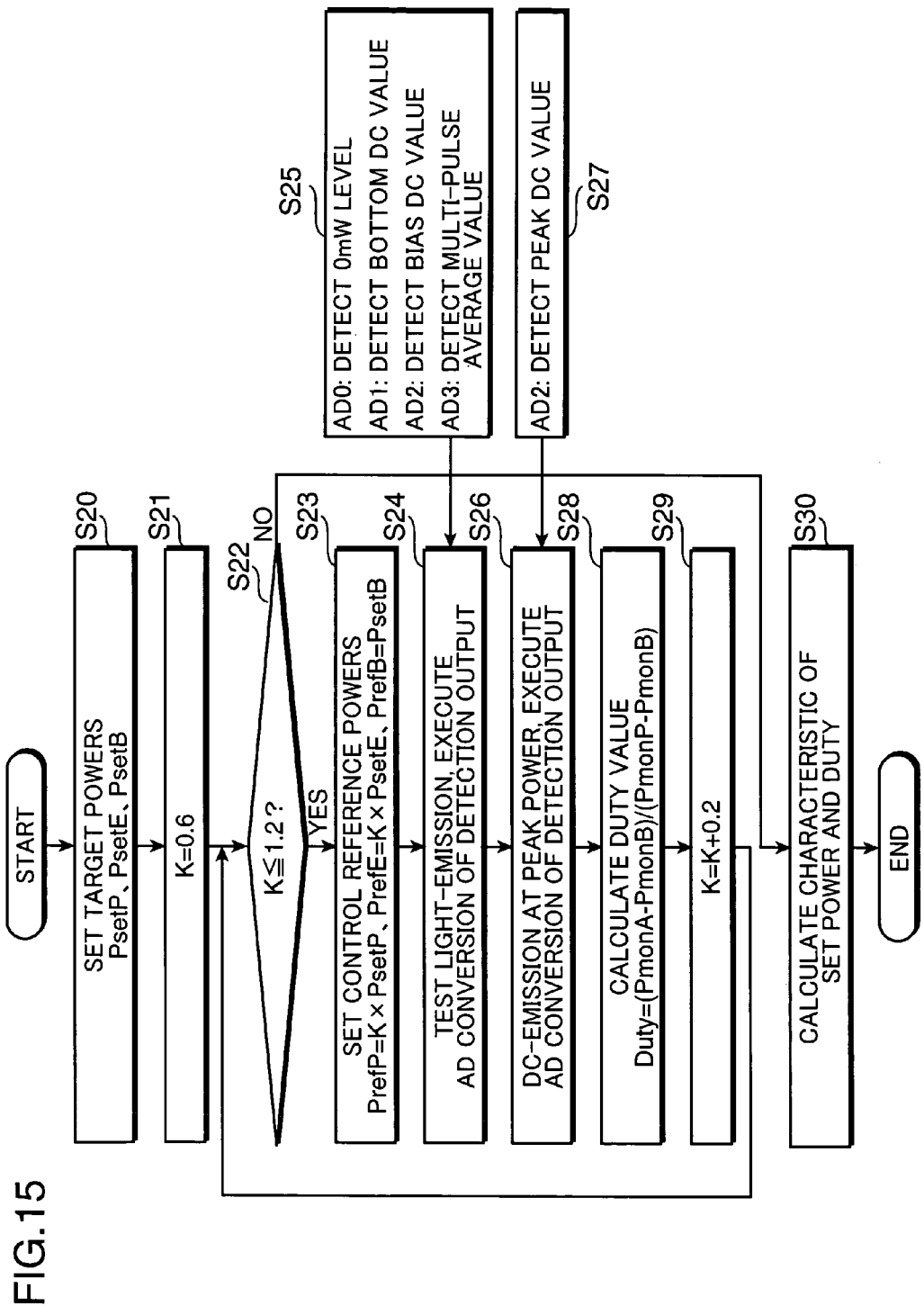
FIG. 15 is a flow chart for obtaining the relation between a set power and a duty according to the second embodiment of the present invention.

As shown in the flow chart of FIG. 15, this operation is executed by varying the set power from the low level to the high level. Thereby, a table is obtained which shows the relation of the optical pulse's duty to the set power.

First, a peak power, a bias power and a bottom power which are used for ordinal data recording are defined as PP, PE and PB, respectively (in a step S20). Next, the flow of steps S21 to S23 is executed, so that a set power becomes 0.6PP, 0.6PE and PB. In other words, a coefficient K is set at 0.6 (in the step S21). Next, a decision is made whether or not the coefficient K is 1.2 or less (in a step S22). Herein, if the decision is made that the coefficient K is 1.2 or less (i.e., YES at the step S22), then the processing goes to a step S23. On the other hand, if the decision is made that the coefficient K is more than 1.2 (i.e., NO at the step S22), then the processing jumps to a step S30. If the decision is made that the coefficient K is 1.2 or less, control reference powers (i.e., the target power values) PrefP, PrefE and PrefB are set at K×PP, K×PE and PB, respectively (in the step S23). Similarly to the first embodiment, an optical pulse is generated in the test light-emission. Then, the detection value of each power is subjected to an AD conversion (in a step S24, S25, S26 and S27). The arithmetic processor 124 calculates the duty d, using the following expression (32) (in a step S28).

Figure 16:
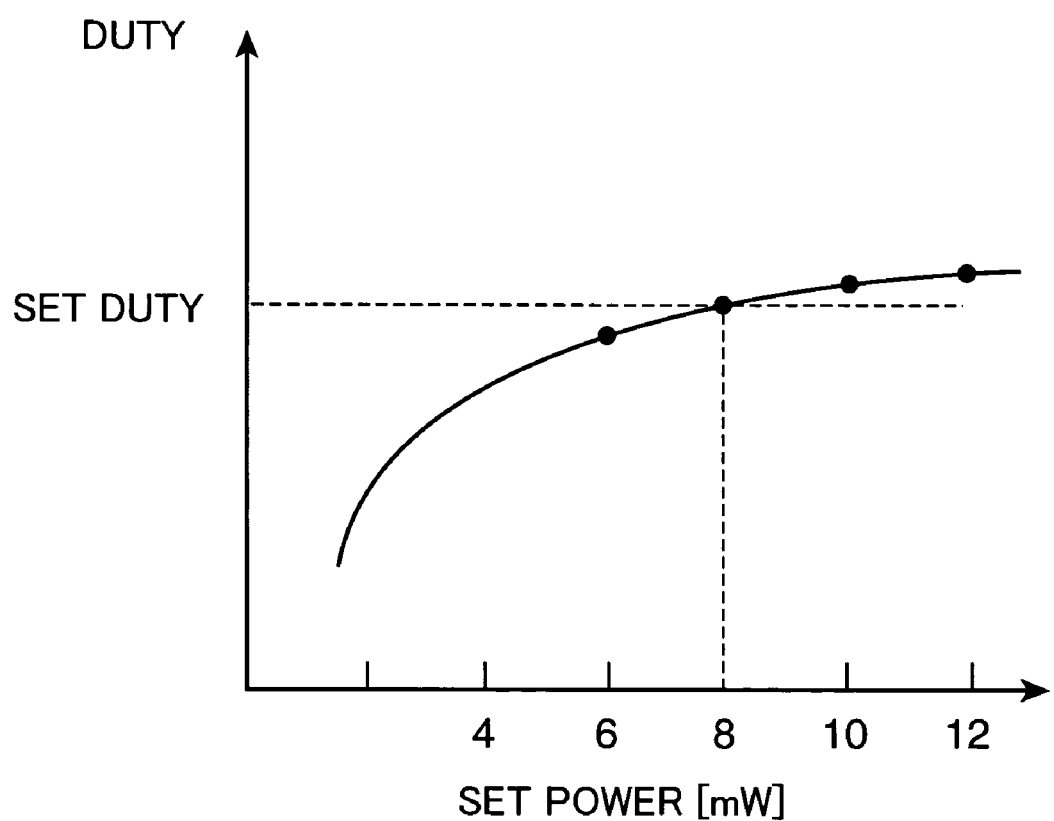
FIG. 16 is a graphical representation, showing a characteristic of the duty of an optical pulse with respect to a set power.

Next, 0.2 is added to the coefficient K, and the processing returns to the step S22 (in a step S29). Then, the processing of the step S29 and the steps S23 to S28 is repeated. Thereby, the set peak power and the bias power are each changed, such as 0.8, 1, 1.2 times as great as PP and PB, so that the duty d is calculated. If the decision is made that the coefficient K is more than 1.2, then based on the obtained duty d, as shown in FIG. 16, the relation of the optical pulse's duty d to the set power is obtained (in the step S30).

Then, this relation of the optical pulse's duty d to the set power is stored as a table in the EP-ROM 160.

When a recording operation is practically executed in an optical disk, the arithmetic processor 124 reads, from the table of the EP-ROM 160, the duty value that is used in an arithmetic operation which corresponds to the designated peak-power set value PsetP. Then, it uses the duty value, so that control at the peak power can be executed more precisely.

Even in the case where the duty of an optical pulse is shifted from a set duty, and in addition, the duty's discrepancy depends upon the crest value (or peak value) of a pulse current for driving a laser, if the above described correction is executed, the peak power is calculated, using the actual optical pulse's duty value as the duty which is used in an arithmetic operation. Therefore, the laser power can be controlled more precisely.

Furthermore, in the EP-ROM 160, the relation between the optical pulse's duty and the target power value are stored as the correction value. Thus, the DSP 124 corrects the duty which corresponds to the target power value, based on the correction value stored in the EP-ROM 160. Then, the DSP 124 executes an arithmetic operation of the light-emission power value, based on the average value of the optical pulse calculated by the low-pass filter 114 and the duty corrected by the DSP 124, and then, calculates the difference between the light-emission power value and a reference value which corresponds to the target power value. Then, it controls the electric-current value which is supplied to the semiconductor laser, based on the difference it obtained. Finally, the laser drive circuit 140 drives the semiconductor laser 150, based on the electric-current value controlled by the DSP 124.

Thus, the relation between the optical pulse's duty and the target power value are stored beforehand as the correction value. Thereby, the duty which corresponds to the target power value can be easily corrected, thus helping control the laser extremely precisely.

Herein, the relation of the duty to a pulse current for driving a laser may also be stored as a table in the EP-ROM 160. In that case, the pulse current is calculated using the designated peak-power set value PsetP. Then, the duty which corresponds to this pulse current becomes the duty which is used in an arithmetic operation. This presents the same advantage.

Figure 17:
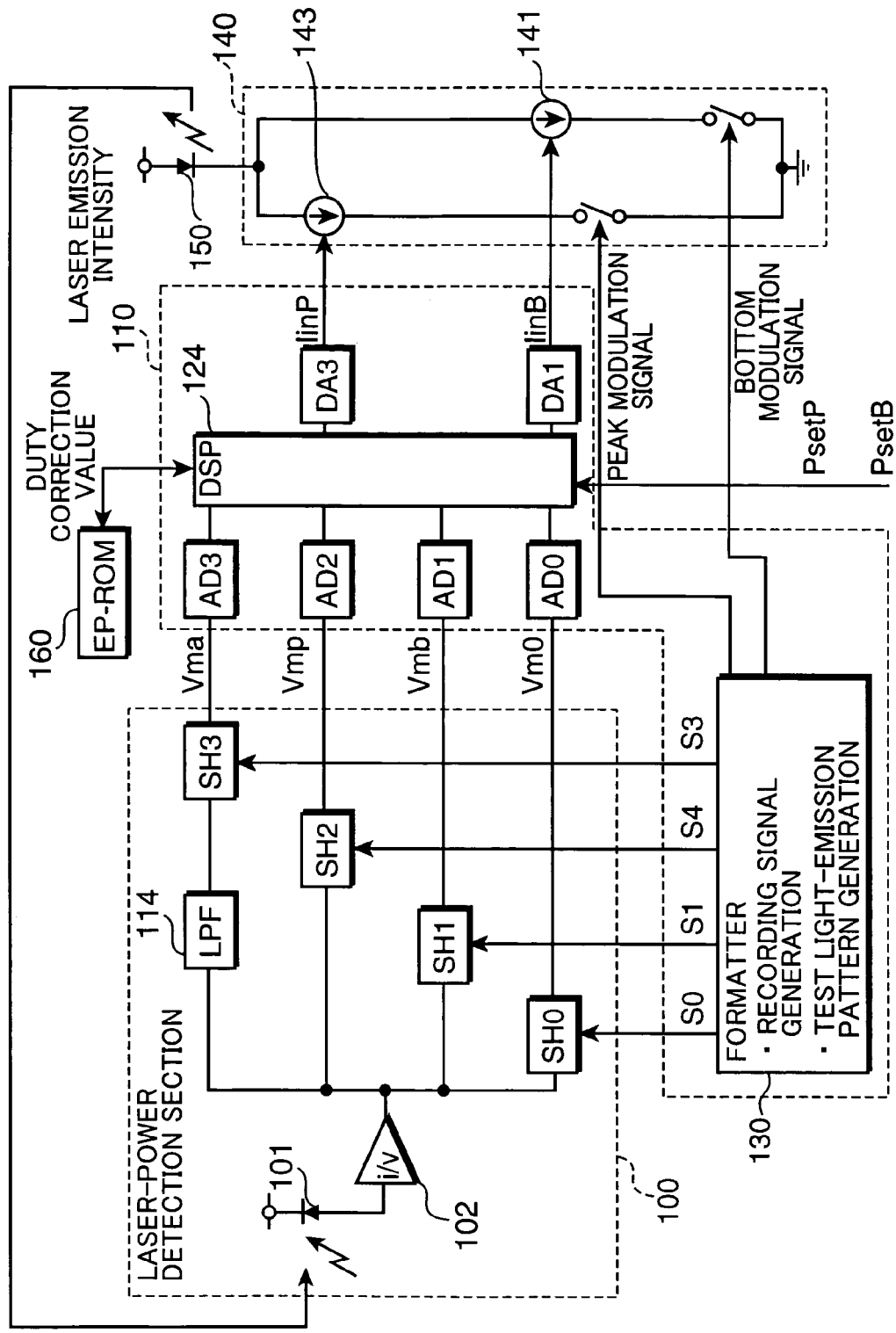
FIG. 17 is a block diagram, showing the configuration of a laser control unit according to a variation of the second embodiment.
Figure 18:
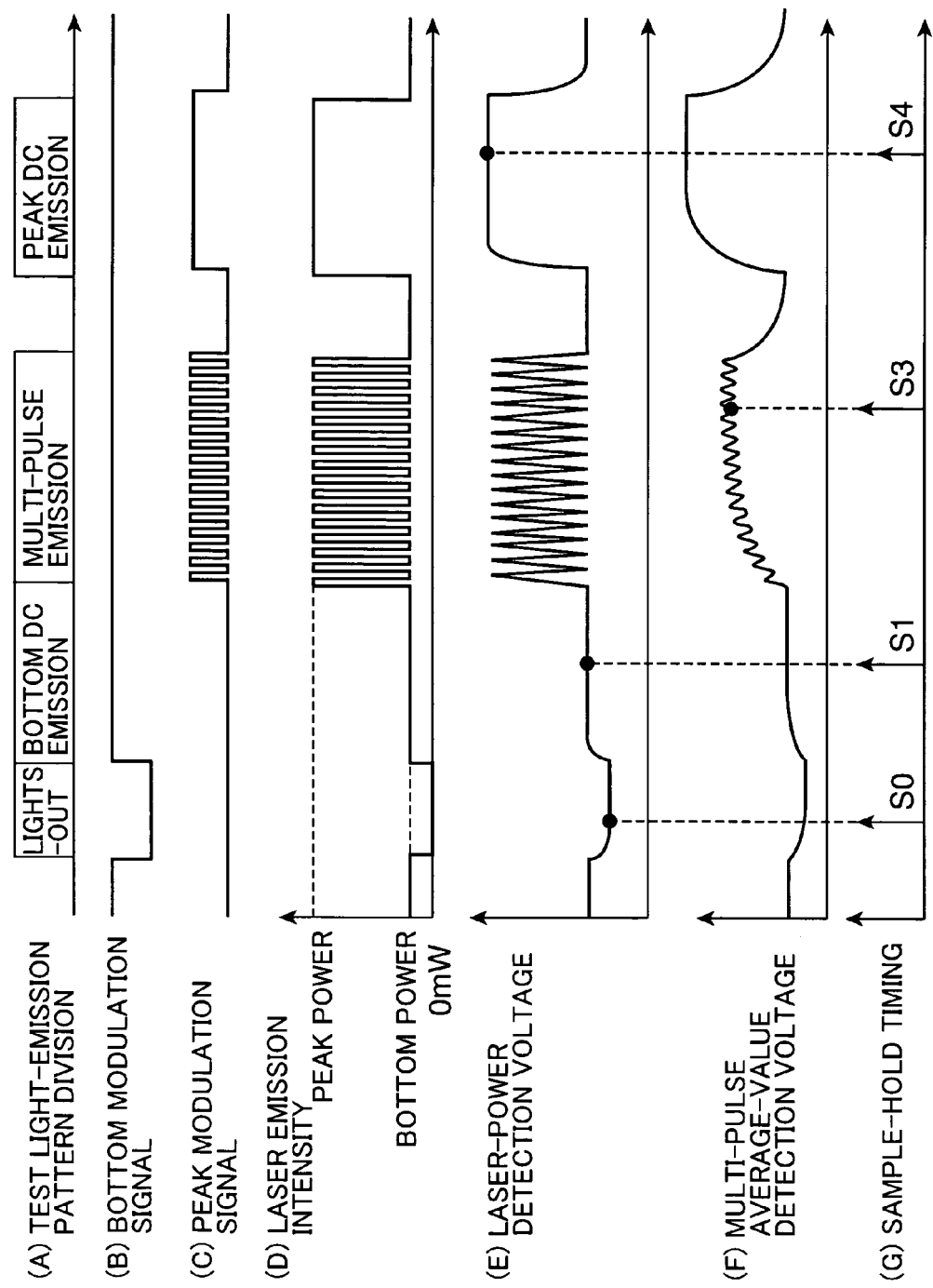
FIG. 18 is a graphical representation, showing an operational sequence of the laser control unit according to the variation of the second embodiments of the present invention.
Figure 19:
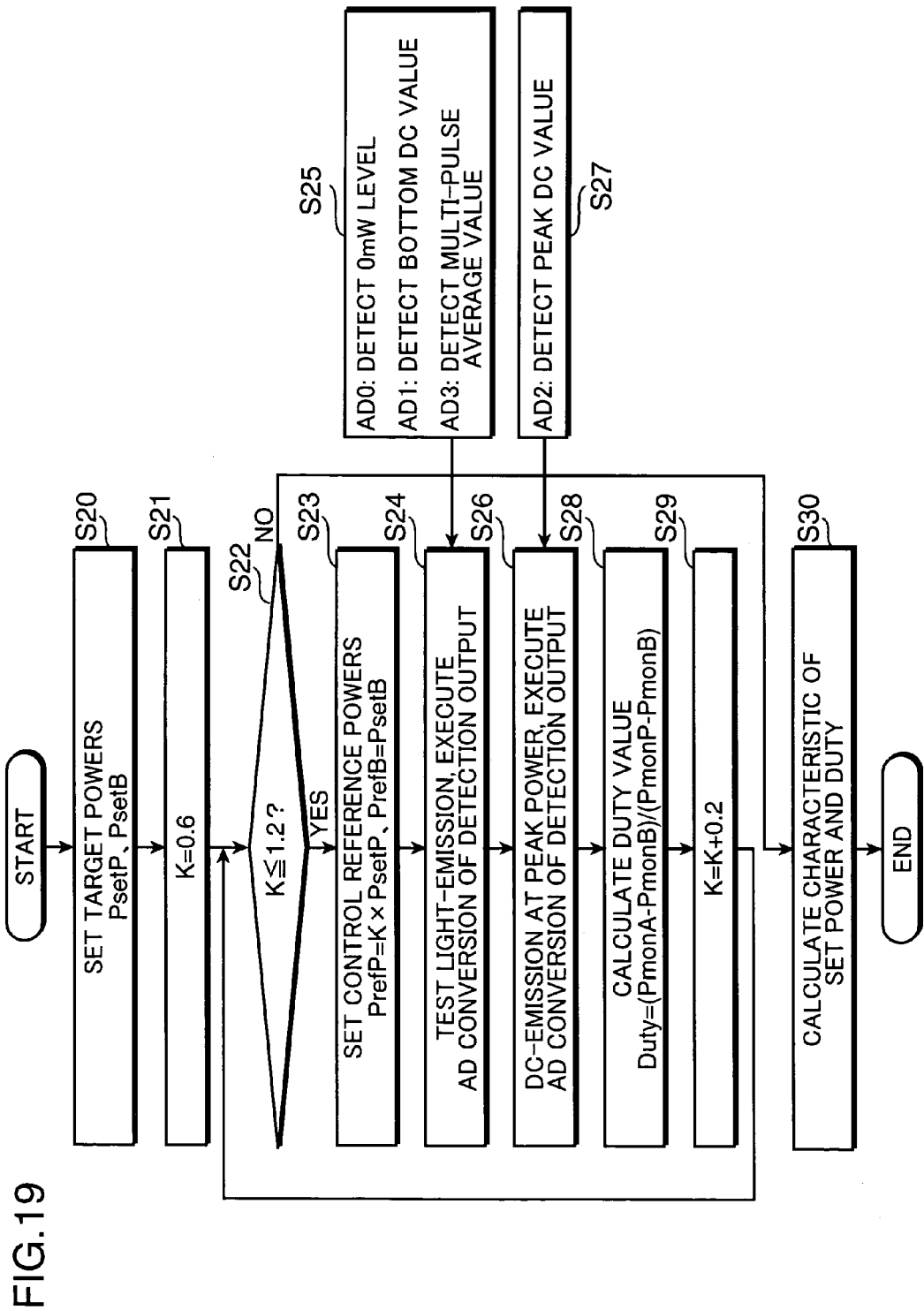
FIG. 19 is a flow chart for obtaining the relation between a set power and a duty according to the variation of the second embodiment of the present invention.

Furthermore, in this embodiment, recording in a rewritable-type optical disk is taken into account. Thus, the description is given about controlling each power value of an optical pulse which is made up of a peak value, a bottom value and a bias value. However, the present invention is not limited to this. For example, recording in a write-once type optical disk may also be taken into account. In that case, each power value of an optical pulse is controlled which is made up of a peak value and a bottom value. FIG. 17 is a block diagram, showing the configuration of a laser control unit according to a variation of the second embodiment. FIG. 18 is a graphical representation, showing an operational sequence of the laser control unit according to the variation of the second embodiment. FIG. 19 is a flow chart for obtaining the relation between a set power and a light-emission power according to the variation of the second embodiment.

The laser control unit according to the variation of the second embodiment records data in a write-once type optical disk. It controls each power value of an optical pulse which is made up of a peak value and a bottom value. Herein, in FIG. 17, the DA converter DA2 and bias current source 142 are not provided, which is different from FIG. 13. However, the other components are the same as those of FIG. 13, and thus, their description is omitted. The operational sequence shown in FIG. 18 is also different from the operational sequence shown in FIG. 14. The former is not provided with an interval in which a DC light emission is executed at a bias power. But, the rest of the operational sequence is the same as that of FIG. 14, and thus, its description is omitted. In addition, in the flow chart shown in FIG. 19, the bias DC emission is skipped, which is different from the flow chart shown in FIG. 15. However, the other processing is the same as that of FIG. 15, and thus, its description is omitted.

Third Embodiment

Figure 20:
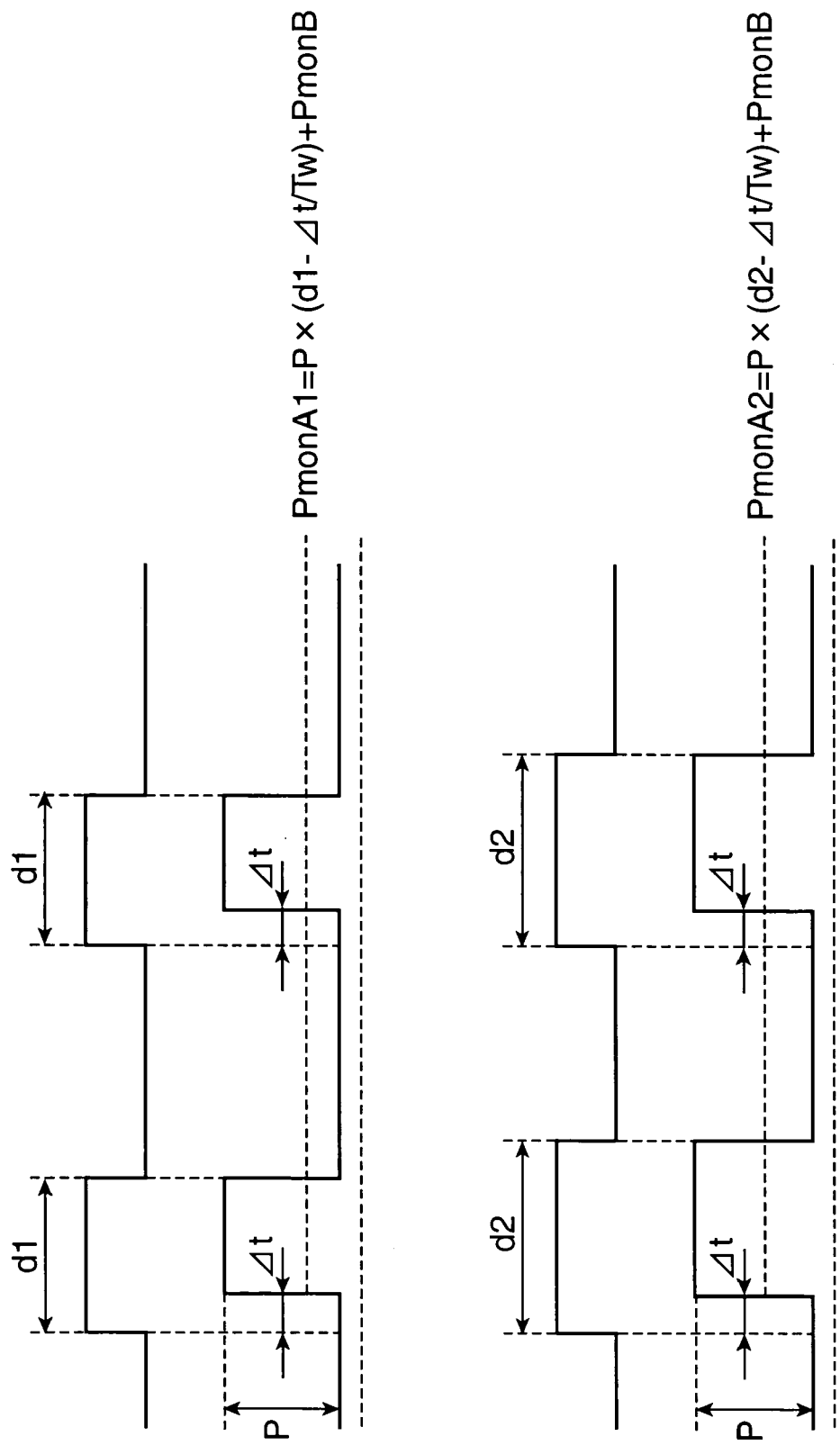
FIG. 20 is a representation, showing that the discrepancy is the same time-width in either case where a duty is narrow or wide according to a third embodiment of the present invention.

A third embodiment of the present invention is designed to resolve the problem of the discrepancy between a light-emission power and a set power, without using the broadband photo-detector used in the first embodiment, as well as without executing the DC light emission at the peak in the second embodiment. As shown in FIG. 20, at the time of a constant pulse current, the duty's discrepancy is substantially equal to a fixed pulse width, in either case where the duty is narrow or wide. This embodiment focuses on this matter. Specifically, at a constant pulse current, a multi-pulse light emission is executed, using two duties different from each other. Thus, a discrepancy Δt in pulse width is calculated.

Figure 21:
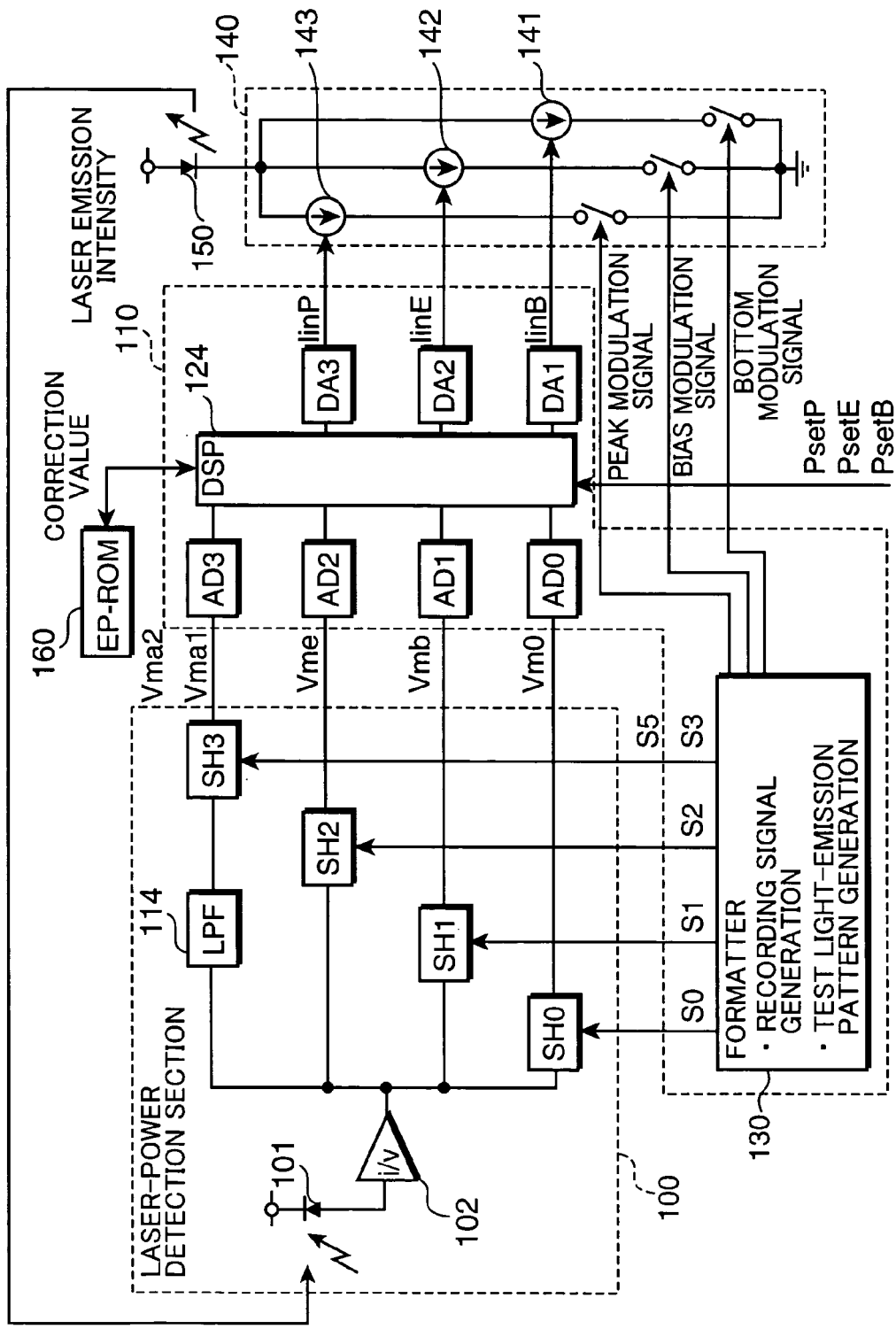
FIG. 21 is a block diagram, showing the configuration of a laser control unit according to the third embodiment of the present invention.
Figure 22:
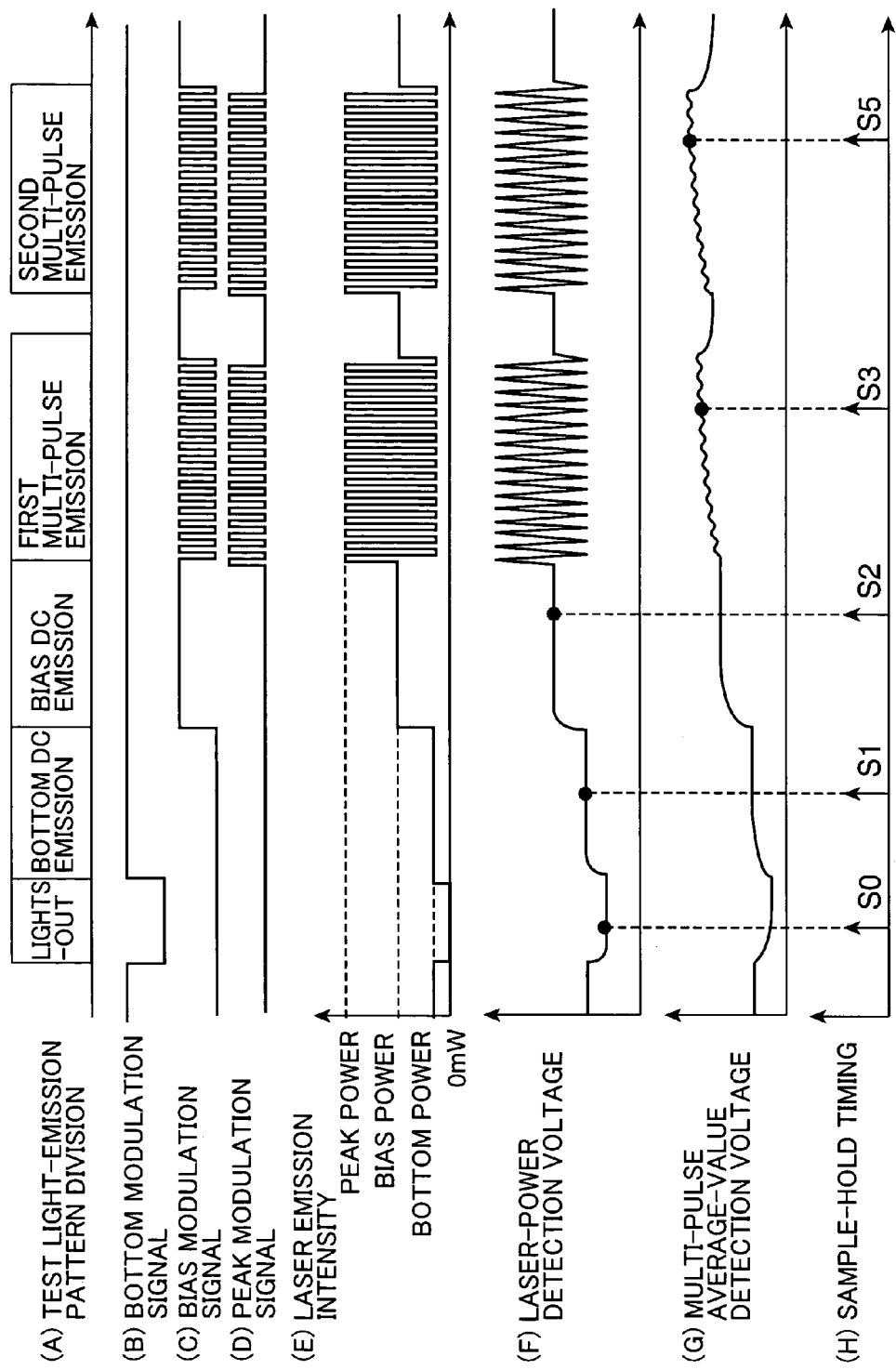
FIG. 22 is a graphical representation, showing an operational sequence of the laser control unit according to the third embodiment of the present invention.
Figure 23:
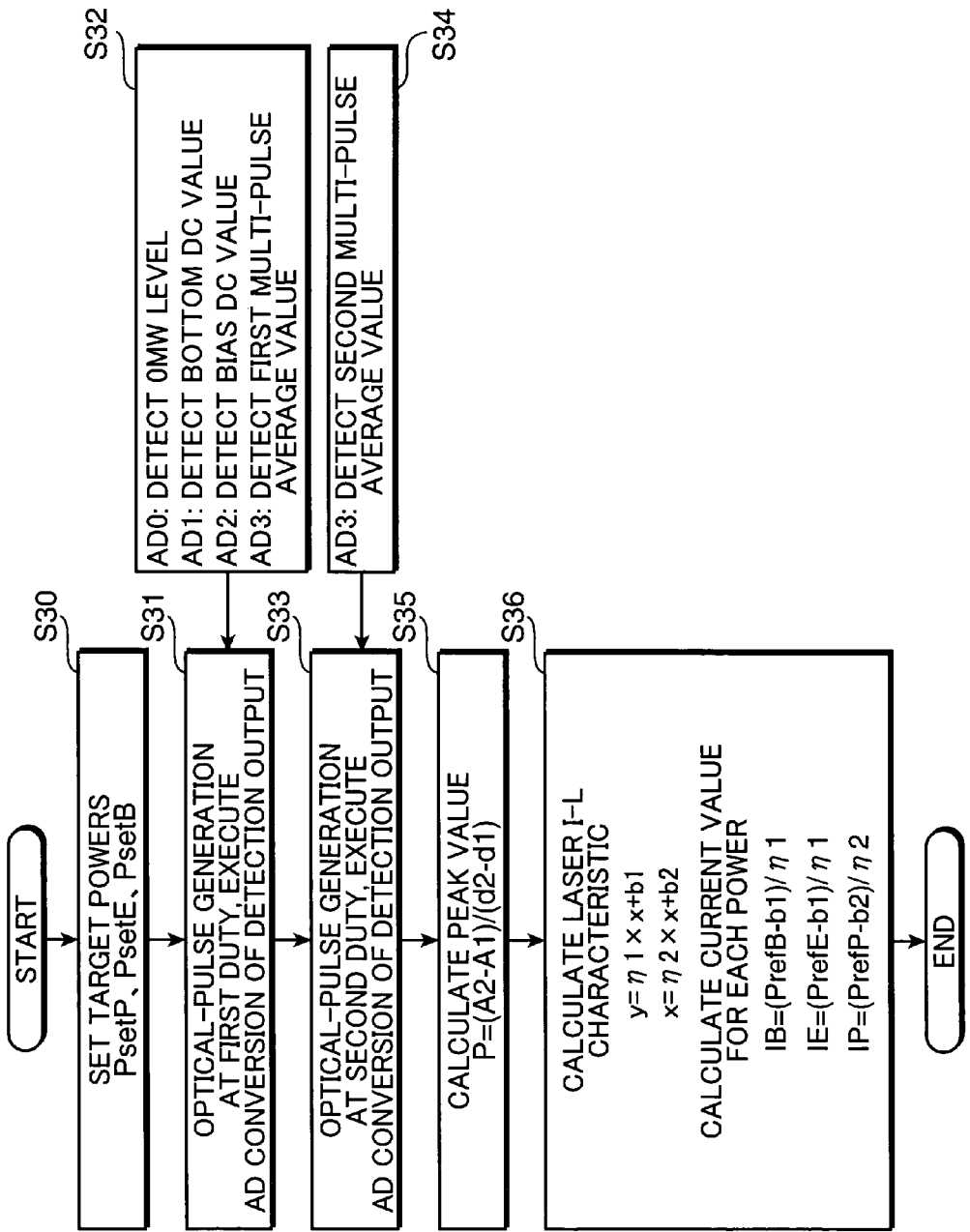
FIG. 23 is a flow chart, showing the operation of laser control according to the third embodiment of the present invention.

FIG. 21 is a block diagram, showing the configuration of a laser control unit according to the third embodiment of the present invention. FIG. 22 is a graphical representation, showing an operational sequence of the laser control unit according to the third embodiment of the present invention. FIG. 23 is a flow chart, showing the operation of laser control according to the third embodiment of the present invention. Herein, only the configuration different from those according to the first and second embodiments is described below, suitably using the operational sequences in FIG. 22 and the flow chart in FIG. 23.

The test light-emission includes a first multi-pulse light-emission interval in which the duty of an optical pulse is narrow and a second multi-pulse light-emission interval in which the duty of an optical pulse is wide. Hence, in the third embodiment, as shown in FIG. 22(A), the test light-emission is made up of: an interval in which the laser's light is turned off; an interval in which a DC light emission is executed at a bottom power; an interval in which a DC light emission is executed at a bias power; an interval in which a multi-pulse light emission is executed between the peak power and the bottom power; the first multi-pulse light-emission interval; and the second multi-pulse light-emission interval.

First, a command for the peak-power set value PsetP, the bias-power set value PsetE and the bottom-power set value PsetB is given to the arithmetic processor 124 (in a step S30 in FIG. 23). In the same way as in the first embodiment, the arithmetic processor 124 calculates the bottom current value IB, the bias current value IE and the peak current value IP. Next, it calculates the electric-current value IinB which is inputted in the bottom current source 141, the electric-current value IinE which is inputted in the bias current source 142 and the electric-current value IinP which is inputted in the peak current source 143. Sequentially, these electric-current values InB, IinE and IinP which are inputted in the laser drive circuit 140 are converted into an analog electric-current value by the DA converters DA1, DA2 and DA3, respectively. Then, they are inputted in the laser drive circuit 140.

Based on a bottom modulation signal, a bias modulation signal and a peak modulation signal which are inputted in the laser drive circuit 140 from the formatter 130, an optical pulse shown in FIG. 22(E) is obtained which contains the laser's lights-out, a DC light emission at the bottom power, a DC light emission at the bias power, a multi-pulse light emission at a set duty d1 (e.g., 40%) and a multi-pulse light emission at a set duty d2 (e.g., 50%).

The optical pulse which has been generated in this process is detected by the laser-power detection section 100. When receiving a laser beam, the light-receiving element 101 outputs laser power as an electric current. This electric current outputted by the light-receiving element 101 is converted, as shown in FIG. 22(F), into a voltage value by the current-voltage conversion circuit 102.

In the interval where the light is turned off, the sample-hold circuit SH0 holds the output voltage of the current-voltage conversion circuit 102, based upon the sample-hold signal S0. Then, it outputs the 0 mW-level detection voltage vm0. Thereafter, in the bottom-power emission interval, the sample-hold circuit SH1 holds the output voltage of the current-voltage conversion circuit 102, based upon the sample-hold signal S1. Then, it outputs the bottom-power detection voltage Vmb. Thereafter, in the bias-power emission interval, the sample-hold circuit SH2 holds the output voltage of the current-voltage conversion circuit 102, based upon the sample-hold signal S2. Then, it outputs the bias-power detection voltage Vme. Thereafter, in the first multi-pulse emission interval, the output voltage of the current-voltage conversion circuit 102 undergoes a band limitation in the low-pass filter 114. Thereby, a voltage is obtained which corresponds to the average value of the first multi-pulse emission. The sample-hold circuit SH3 holds the voltage obtained in this way which corresponds to the average value of the first multi-pulse emission, based upon the sample-hold signal S3. Then, it outputs a first multi-pulse average-value detection voltage Vma1.

The 0 mW-level detection voltage Vm0, bottom-power detection voltage Vmb, bias-power detection voltage Vme and first multi-pulse average-value detection voltage Vma1 which have been obtained in the laser-power detection section 100, are converted into a digital value by the AD converters AD0, AD1, AD2, AD3, respectively (in steps S31 and S32 in FIG. 23).

In addition, thereafter, in the second multi-pulse emission interval, the output voltage of the current-voltage conversion circuit 102 undergoes a band limitation in the low-pass filter 114. Thereby, a voltage is obtained which corresponds to the average value of the second multi-pulse emission. The sample-hold circuit SH3 holds the voltage obtained in this way which corresponds to the average value of the second multi-pulse emission, based upon the sample-hold signal S5. Then, it outputs a second multi-pulse average-value detection voltage Vma2. This second multi-pulse average-value detection voltage Vma2 is converted into a digital value by the AD converter AD3 (in steps S33 and S34 in FIG. 23).

Herein, in this embodiment, based upon the sample-hold signal S5, the sample-hold circuit SH3 holds the voltage which corresponds to the average value of the second multi-pulse emission, and then, outputs the second multi-pulse average-value detection voltage Vma2. However, the present invention is not limited especially to this. The following low-pass filter, sample-hold circuit and AD converter may also be further provided. Specifically, the low-pass filter executes a band limitation, so that a voltage is obtained which corresponds to the average value of the second multi-pulse emission. The sample-hold circuit holds the voltage which corresponds to the average value of the second multi-pulse emission, and then, outputs the second multi-pulse average-value detection voltage Vma2. The AD converter executes an AD conversion of the second multi-pulse average-value detection voltage Vma2.

Sequentially, using the 0 mW-level detection voltage Vm0, each detection voltage is converted into a power value by subtracting an offset of the laser-power detection section 100 in the arithmetic processor 124. Specifically, the bottom detection power PmonB, the bias detection power PmonE, the first multi-pulse average detection power PmonA1 and the second multi-pulse average detection power PmonA2 are calculated, using the following expressions (33) to (36), respectively.

$$PmonB = Vmb - Vm0 \tag{33}$$

$$PmonE = Vme - Vm0 \tag{34}$$

$$PmonA1 = Vma1 - Vm0 \tag{35}$$

$$PmonA2 = Vma2 - Vm0 \tag{36}$$

The peak power of an optical pulse and the duty's discrepancy are calculated as described below. First, at the time of the test light-emission, an actual peak power is P. In either case where the set duty is d1 or d2, their pulse-width discrepancies $\Delta t$ are equal to each other. If the pulse's cycle is Tw, then the duty which has the pulse-width discrepancy $\Delta t$ at the set duty d1 is expressed with (d1−$\Delta t$/Tw). Similarly, the duty which has the pulse-width discrepancy $\Delta t$ at the set duty d2 is expressed with (d2−$\Delta t$/Tw). This gives the following two expressions (37) and (38).

$$PmonA1 - PmonB = P \times (d1 - \Delta t/Tw) \tag{37}$$

$$PmonA2 - PmonB = P \times (d2 - \Delta t/Tw) \tag{38}$$

In these two expressions, only the actual peak power P and the pulse-width discrepancy $\Delta t$ are unknown numerical values. Thereby, if a simultaneous equation with respect to the P and $\Delta t$ is solved, the actual peak power P and the pulse-width discrepancy $\Delta t$ are calculated, using the following expressions (39) and (40).

$$P=(A2-A1)/(d2-d1) \quad (39)$$

$$\Delta t=[\{(PmonA2-PmonB) \times d1-(PmonA1-PmonB) \times d2\}/(PmonA2-PmonA1)] \times Tw \quad (40)$$

The peak powerP obtained here becomes the peak detection power PmonP (in a step S35 in FIG. 23).

In the process described below, the arithmetic processor 124 calculates the laser's I-L characteristic at this point of time, and then, controls the laser drive current so that a light emission can be executed at a desired laser power. Based upon the bottom detection power PmonB, the bias detection power PmonE, and the bias current value IE and bottom current value IB at the time of the test light-emission, the laser's I-L characteristic between the bottom power and the bias power is approximately expressed in the following expression (41).

$$y=\eta 1 \times x + b1 \quad (41)$$

Herein, η1, b1 are expressed in the following expressions (42) and (43), respectively.

$$\eta 1=(PmonE-PmonB)/(IE-IB) \quad (42)$$

$$b1=(PmonB \times IE - PmonE \times IB)/(IE-IB) \quad (43)$$

In addition, based upon the relation between the detection powers PmonP, PmonB and the drive electric-current values Ip, IB, the laser's I-L characteristic is approximately expressed in the following expression (44).

$$y=\eta 2 \times x + b2 \quad (44)$$

Herein, η2, b2 are expressed in the following expressions (45) and (46), respectively.

$$\eta 2=(PmonP-PmonB)/(IP-IB) \quad (45)$$

$$b2=(PmonB \times IP - PmonP \times IB)/(IP-IB) \quad (46)$$

Based upon these arithmetic results, the laser's drive current is controlled as described below. Herein, if the target power values for the control of bottom power, bias power and peak power, which are used in arithmetic operations, are designated as PrefB, PrefE and PrefP, respectively, then these target power values are equal to the values which are commanded by the arithmetic processor 124. Thus, they are expressed in the following expressions (47) to (49), respectively.

$$PrefB = PsetB \quad (47)$$

$$PrefE = PsetE \quad (48)$$

$$PrefP = PsetP \quad (49)$$

Therefore, the bottom current value IB, bias current value IE and peak current value IP are calculated in the following expressions (50) to (52), respectively.

$$IB=(PrefB-b1)/\eta 1 \quad (50)$$

$$IE=(PrefE-b1)/\eta 1 \quad (51)$$

$$IP=(PrefP-b2)/\eta 2 \quad (52)$$

Thus, the electric-current value IinB, IinE and IinP which are inputted in the electric-current sources 141, 142, 143, are updated in the following expressions (53) to (55), respectively.

$$IinB=IB \quad (53)$$

$$IinE=IE-IB \quad (54)$$

$$IinP=IP-IE \quad (55)$$

Using the above described process, the laser's power is controlled (in a step S36 in FIG. 23).

Even in the case where the duty of an optical pulse is shifted from a set duty, and in addition, the duty's discrepancy depends upon the crest value (or peak value) of a pulse current for driving a laser, if the above described method is executed, the actual peak power P and the duty's discrepancy Δt can be accurately detected. Therefore, the laser power can be precisely controlled.

Hence, the semiconductor laser 150 generates a first optical pulse which includes a first duty, and generates a second optical pulse which includes a second duty different from the first duty. Next, the light-receiving element 101 converts, into an electric signal, the first optical pulse generated by the semiconductor laser 150 and outputs a first photo-detection signal, and then, converts, into an electric signal, the second optical pulse generated by the optical-pulse generating circuit and outputs a second photo-detection signal. Sequentially, the low-pass filter 114 calculates the average value of the first optical pulse, based on the first photo-detection signal outputted by the light-receiving element 101, and calculates the average value of the second optical pulse, based on the second photo-detection signal outputted by the light-receiving element 101. Then, the DSP 124 calculates an peak value of the optical pulse, based on the average value of the first optical pulse and the average value of the second optical pulse which have been calculated by the low-pass filter 114. Next, it calculates the relation of light-emission power to an electric current for driving the semiconductor laser 150, based on the calculated peak value, and then, controls an electric-current value which is supplied to the semiconductor laser 150. Finally, the laser drive circuit 140 drives the semiconductor laser 150, based on the electric-current value controlled by the DSP 124.

Therefore, two optical pulses whose duties are different from each other are generated. Then, based upon those generated optical pulses, an peak value is calculated. Next, based upon the calculated peak value, the electric-current value which is supplied to the semiconductor laser is controlled. Thus, even if the duty of an optical pulse is shifted from a preset duty, the peak value of the optical pulse can be precisely controlled. This makes it possible to control the laser power more precisely.

Herein, using this method, when the process is adjusted, the unit is started, or in another such case, a table may also be obtained which shows the discrepancy Δt between the duty and the set power. In that case, it is stored in the EP-ROM 160. When a recording operation is actually executed, this table is read, and then, it is used for the calculation of a peak value by the arithmetic processor 124.

In this case, the discrepancy between the duty and the target power value is stored in advance as a correction value in the EP-ROM 160. Thus, the DSP 124 corrects the peak value of the optical pulse, using the correction value stored in the EP-ROM 160. Then, it calculates the relation of light-emission power to an electric current for driving the semiconductor laser 150, based on the corrected peak value, and then, controls an electric-current value which is supplied to the semiconductor laser 150. Finally, the laser drive circuit 140 drives the semiconductor laser 150, based on the electric-current value controlled by the DSP 124.

Hence, the discrepancy between the duty and the target power value is stored in advance as a correction value, and using this correction value, the peak value of the optical pulse is corrected. Therefore, the peak value can be calculated without being affected by the duty's discrepancy. This makes it possible to control the laser extremely precisely.

Figure 24:
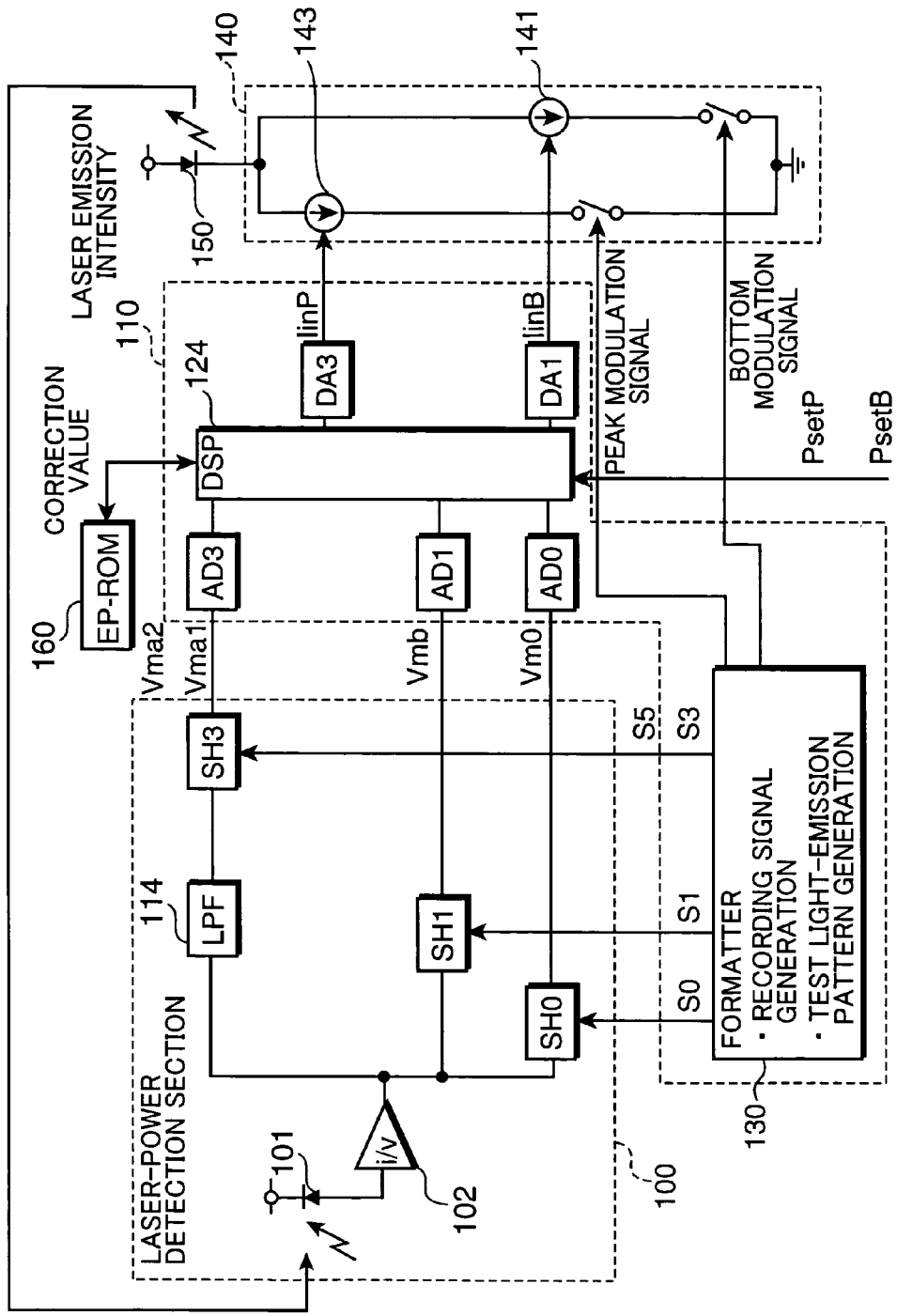
FIG. 24 is a block diagram, showing the configuration of a laser control unit according to a variation of the third embodiment.
Figure 25:
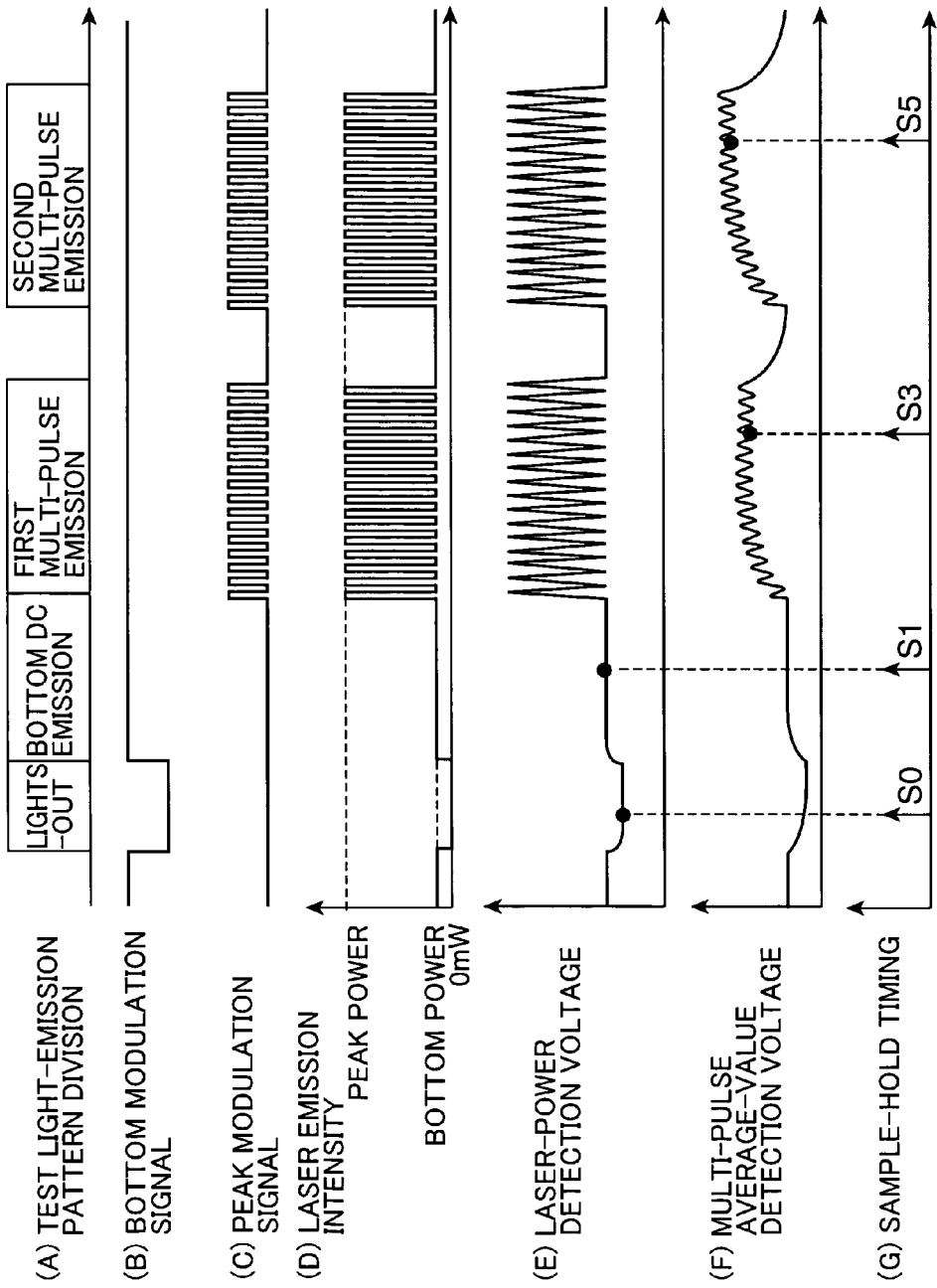
FIG. 25 is a graphical representation, showing an operational sequence of the laser control unit according to the variation of the third embodiment of the present invention.
Figure 26:
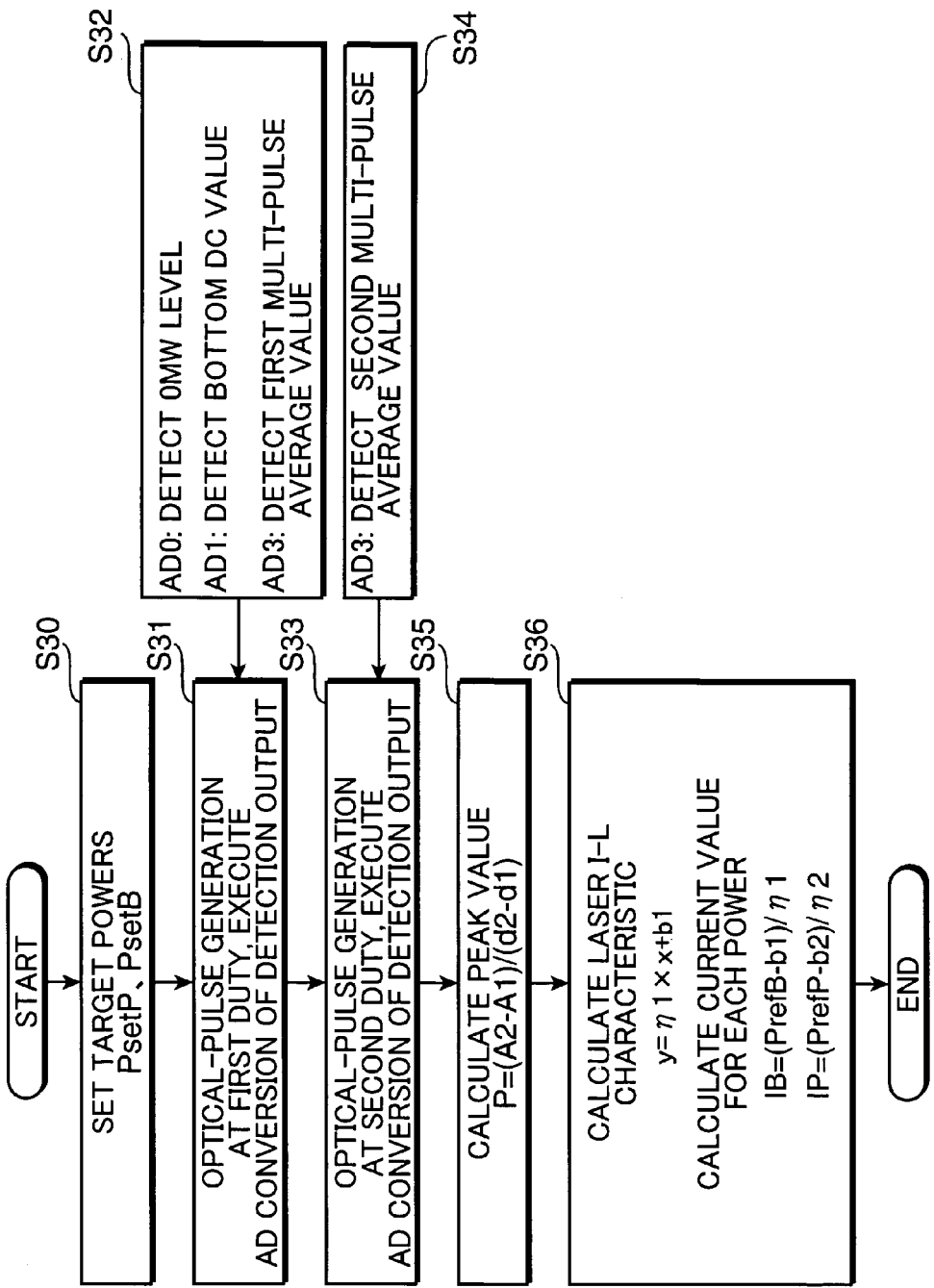
FIG. 26 is a flow chart, showing the operation of laser control according to the variation of the third embodiment of the present invention.

Furthermore, in this embodiment, recording in a rewritable-type optical disk is taken into account. Thus, the description is given about controlling each power value of an optical pulse which is made up of a peak value, a bottom value and a bias value. However, the present invention is not limited to this. For example, recording in a write-once type optical disk may also be taken into account. In that case, each power value of an optical pulse is controlled which is made up of a peak value and a bottom value. FIG. 24 is a block diagram, showing the configuration of a laser control unit according to a variation of the third embodiment. FIG. 25 is a graphical representation, showing an operational sequence of the laser control unit according to the variation of the third embodiment. FIG. 26 is a flow chart for obtaining the relation between a set power and a light-emission power according to the variation of the third embodiment.

The laser control unit according to the variation of the third embodiment records data in a write-once type optical disk. It controls each power value of an optical pulse which is made up of a peak value and a bottom value. Herein, in FIG. 24, the sample-hold circuit SH2, AD converter AD2, DA converter DA2 and bias current source 142 are not provided, which is different from FIG. 21. However, the other components are the same as those of FIG. 21, and thus, their description is omitted. The operational sequence shown in FIG. 25 is also different from the operational sequence shown in FIG. 22. The former is not provided with an interval in which a DC light emission is executed at a bias power. But, the rest of the operational sequence is the same as that of FIG. 22, and thus, its description is omitted. In addition, in the flow chart shown in FIG. 26, the bias DC emission is skipped, which is different from the flow chart shown in FIG. 23. However, the other processing is the same as that of FIG. 23, and thus, its description is omitted.

The laser control unit, laser control circuit and laser-power adjustment method according to the present invention are capable of controlling the laser power extremely precisely by correcting an error in the duty of an optical pulse. They are useful for a recording regeneration unit which is used for an optical disk such as a DVD, or another such unit.

This application is based on Japanese patent application serial No. 2003-384896, filed in Japan Patent Office on Nov. 14, 2003, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A laser control unit which executes control so that a light-emission power value of an optical pulse which is used to form a record mark on a recording track of an optical disk becomes a target power value, comprising:

an outputting circuit for converting, into an electric signal, the optical pulse which is generated by a semiconductor laser, and outputting a photo-detection signal;

an average-value calculating circuit for calculating an average value of the optical pulse, based on the photo-detection signal which is outputted by the outputting circuit;

an arithmetic-operation executing circuit for executing an arithmetic operation of the light-emission power value, based on the average value of the optical pulse which is calculated by the average-value calculating circuit and a duty of the optical pulse, and calculating the difference between the light-emission power value and the target power value;

a correction-value storing circuit for storing a correction value for correcting an arithmetic operation which is executed by the arithmetic-operation executing circuit;

a correcting circuit for correcting the arithmetic operation which is executed by the arithmetic-operation executing circuit, based on the correction value which is stored in the correction-value storing circuit;

a controlling circuit for controlling an electric-current value which is supplied to the semiconductor laser, based on the arithmetic result which is corrected by the correcting circuit; and a laser driving circuit for driving the semiconductor laser, based on the electric-current value which is controlled by the controlling circuit.

2. The laser control unit according to claim 1, wherein:

the correction-value storing circuit stores the intercept and gradient of a linear function as the correction value, the linear function being obtained by approximating the relation between the target power value and the light-emission power value in advance;

the correcting circuit corrects the target power value, based on the correction value which is stored in the correction-value storing circuit;

the arithmetic-operation executing circuit executes an arithmetic operation of the difference between the target power value corrected by the correcting circuit and the light-emission power value; and the controlling circuit controls an electric-current value which is supplied to the semiconductor laser, based on the difference which is calculated by the arithmetic-operation executing circuit.

3. The laser control unit according to claim 1, wherein:

the correction-value storing circuit stores, as the correction value, the discrepancy between the light-emission power value and the target power value;

the correcting circuit corrects the target power value, based on the correction value which is stored in the correction-value storing circuit;

the arithmetic-operation executing circuit executes an arithmetic operation of the difference between the target power value corrected by the correcting circuit and the light-emission power value; and the controlling circuit controls an electric-current value which is supplied to the semiconductor laser, based on the difference which is calculated by the arithmetic-operation executing circuit.

4. The laser control unit according to claim 1, wherein:

the correction-value storing circuit stores, as the correction value, the relation between the duty of the optical pulse and the target power value;

the correcting circuit corrects the duty which corresponds to the target power value, based on the correction value which is stored in the correction-value storing circuit;

the arithmetic-operation executing circuit executes an arithmetic operation of the light-emission power value, based on the average value of the optical pulse which is calculated by the average-value calculating circuit and the duty which is corrected by the correcting circuit, and calculating the difference between the light-emission power value and the target power value; and the controlling circuit controls an electric-current value which is supplied to the semiconductor laser, based on the difference which is calculated by the arithmetic-operation executing circuit.

5. A laser control unit which executes control so that a light-emission power value of an optical pulse which is used to form a record mark on a recording track of an optical disk becomes a target power value, comprising:

an optical-pulse generating circuit for generating a first optical pulse which includes a first duty, and generating a second optical pulse which includes a second duty different from the first duty;

an outputting circuit for converting, into an electric signal, the first optical pulse which is generated by the optical-pulse generating circuit and outputting a first photo-detection signal, and converting, into an electric signal, the second optical pulse which is generated by the optical-pulse generating circuit and outputting a second photo-detection signal;

an average-value calculating circuit for calculating an average value of the first optical pulse, based on the first photo-detection signal which is outputted by the outputting circuit, and calculating an average value of the second optical pulse, based on the second photo-detection signal which is outputted by the outputting circuit;

a peak-value calculating circuit for calculating peak value of the optical pulse, based on the average value of the first optical pulse which is calculated by the average-value calculating circuit and the average value of the second optical pulse which is calculated by the average-value calculating circuit;

a controlling circuit for calculating the relation of light-emission power to an electric current for driving a semiconductor laser, based on the peak value which is calculated by the peak-value calculating circuit, and controlling an electric-current value which is supplied to the semiconductor laser; and a laser driving circuit for driving the semiconductor laser, based on the electric-current value which is controlled by the controlling circuit.

6. The laser control unit according to claim 5, further comprising a correction-value storing circuit for storing in advance, as a correction value, the discrepancy between a duty and the target power value, wherein:

the peak-value calculating circuit corrects the peak value of the optical pulse, using the correction value which is stored in the correction-value storing circuit;

the controlling circuit calculates the relation of light-emission power to an electric current for driving the semiconductor laser, based on the peak value which is calculated by the peak-value calculating circuit, and controls an electric-current value which is supplied to the semiconductor laser; and the laser driving circuit drives the semiconductor laser, based on the electric-current value which is controlled by the controlling circuit.

7. A laser control circuit which executes control so that a light-emission power value of an optical pulse which is used to form a record mark on a recording track of an optical disk becomes a target power value, comprising:

an arithmetic-operation executing circuit for executing an arithmetic operation of the light-emission power value, based on an average value of the optical pulse which is calculated based on a photo-detection signal which is outputted after the optical pulse generated by a semiconductor laser is converted into an electric signal and a duty of the optical pulse, and calculating the difference between the light-emission power value and the target power value;

a correcting circuit for correcting the arithmetic operation which is executed by the arithmetic-operation executing circuit, based on a correction value which is stored in a correction-value storing circuit which stores the correction value for correcting the arithmetic operation executed by the arithmetic-operation executing circuit; and a controlling circuit for controlling an electric-current value which is supplied to a laser driving circuit that drives the semiconductor laser, based on the arithmetic result which is corrected by the correcting circuit.

8. A laser-power adjustment method, comprising:

a first step of setting a target power value of an optical pulse;

a second step of generating a predetermined optical pulse, based on the target power value which is set in the first step, obtaining a photo-detection signal by converting the generated optical pulse into an electric signal, and calculating an average value of the optical pulse;

a third step of executing a DC emission of the optical pulse which is generated in the second step, at a peak value thereof, obtaining a photo-detection signal by converting the optical pulse whose DC emission is executed at the peak value into an electric signal, and calculating the peak value of the optical pulse;

a fourth step of calculating a duty of the optical pulse, based on the average value of the optical pulse which is calculated in the second step and the peak value of the optical pulse which is calculated in the third step;

a fifth step of executing an increment of the target power value of the optical pulse; and a sixth step of calculating, as a correction value, the relation between the target power value and the duty of the optical pulse, by repeating the first to fifth steps.

9. A laser-power adjustment method, comprising:

a first step of setting a target power value of an optical pulse;

a second step of generating a first optical pulse which includes a first duty, based on the target power value which is set in the first step, obtaining a photo-detection signal by converting the generated first optical pulse into an electric signal, and calculating an average value of the first optical pulse;

a third step of generating a second optical pulse which includes a second duty different from the first duty, based on the target power value which is set in the first step, obtaining a photo-detection signal by converting the generated second optical pulse into an electric signal, and calculating an average value of the second optical pulse;

a fourth step of calculating a peak value of the optical pulse, based on the average value of the first optical pulse which is calculated in the second step and the average value of the second optical pulse which is calculated in the third step;

a fifth step of calculating the relation of light-emission power to an electric current for driving a semiconductor laser, based on the peak value which is calculated in the fourth step, and controlling an electric-current value which is supplied to the semiconductor laser; and a sixth step of driving the semiconductor laser, based on the electric-current value which is controlled in the fifth step.

* * * * *

UNITED STATES PATENT AND TRADEMARK OFFICE
CERTIFICATE OF CORRECTION

PATENT NO. : 7,366,080 B2  Page 1 of 1
APPLICATION NO. : 10/986959
DATED : April 29, 2008
INVENTOR(S) : Hisashi Senga et al.

It is certified that error appears in the above-identified patent and that said Letters Patent is hereby corrected as shown below:

In column 29, claim 5, line 25, please change "peak value of the optical pulse," to --a peak value of the optical pulse,--.

Signed and Sealed this

Nineteenth Day of August, 2008

JON W. DUDAS
*Director of the United States Patent and Trademark Office*